US012686097B2

(12) United States Patent
Lin et al.

(10) Patent No.: US 12,686,097 B2
(45) Date of Patent: Jul. 21, 2026

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Yi-Cheng Lin, New Taipei City (TW); Kao-Feng Liao, Hsinchu City (TW); Peng-Chung Jangjian, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 483 days.

(21) Appl. No.: 18/323,970

(22) Filed: May 25, 2023

(65) Prior Publication Data

US 2024/0391049 A1 Nov. 28, 2024

(51) Int. Cl.
B24B 37/005 (2012.01)
B24B 37/04 (2012.01)
H10P 52/40 (2026.01)
(52) U.S. Cl.
CPC .......... B24B 37/005 (2013.01); B24B 37/042 (2013.01); H10P 52/402 (2026.01)
(58) Field of Classification Search
CPC ..... B24B 37/005; B24B 37/04; B24B 37/042; B24B 37/08; B24B 37/10; B24B 37/102; B24B 37/105; B24B 37/107; B24B 37/27; B24B 37/30; B24B 49/08; B24B 49/10; B24B 49/16
See application file for complete search history.

(56) References Cited

U.S. PATENT DOCUMENTS

| | | | | |
|---|---|---|---|---|
| 5,618,447 | A | * | 4/1997 | Sandhu ................... B24B 49/02 |
| | | | | 216/88 |
| 5,868,896 | A | | 2/1999 | Robinson et al. |
| 6,040,244 | A | * | 3/2000 | Arai ........................ B24B 49/04 |
| | | | | 438/692 |
| 6,143,123 | A | * | 11/2000 | Robinson .............. B24B 37/013 |
| | | | | 156/934 |

(Continued)

FOREIGN PATENT DOCUMENTS

| | | |
|---|---|---|
| CN | 109807739 A | 5/2019 |
| CN | 114945797 A | 8/2022 |

(Continued)

*Primary Examiner* — Joel D Crandall
(74) *Attorney, Agent, or Firm* — Harrity & Harrity, LLP

(57) ABSTRACT

A planarization tool is configured to monitor and analyze the condition of a polishing pad over the life of the polishing pad. A piezoelectric pad monitoring device may be mounted to a polishing head of the planarization tool in place of a semiconductor wafer. The piezoelectric pad monitoring device may be pressed against the polishing pad. When pressed against the polishing pad, the piezoelectric pad monitoring device may generate a signal based on a quantity of pad contacts, on the polishing pad, that are in contact with the piezoelectric pad monitoring device. The signal may be provided to a processor of the planarization tool so that the processor may generate, based on the signal, a map of the pad contacts on the polishing pad. The processor may use the map of the pad contacts to determine properties of the polishing pad such as roughness and/or uniformity, among other examples.

20 Claims, 18 Drawing Sheets

(56) References Cited

U.S. PATENT DOCUMENTS

| | | | | |
|---|---|---|---|---|
| 6,169,931 | B1 * | 1/2001 | Runnels ................... | B24B 37/26 |
| | | | | 700/121 |
| 6,702,646 | B1 * | 3/2004 | Gitis ....................... | B24B 49/04 |
| | | | | 451/21 |
| 8,618,718 | B2 | 12/2013 | Qu et al. | |
| 11,835,336 | B2 | 12/2023 | Kildegaard et al. | |
| 12,017,323 | B2 | 6/2024 | Kobata et al. | |
| 2004/0198180 | A1 * | 10/2004 | Toprac ................. | B24D 13/147 |
| | | | | 451/5 |
| 2006/0052036 | A1 * | 3/2006 | Kim ...................... | B24B 53/017 |
| | | | | 451/5 |
| 2007/0149094 | A1 * | 6/2007 | Choi ...................... | B24B 37/20 |
| | | | | 451/8 |
| 2018/0169825 | A1 | 6/2018 | Chen et al. | |
| 2018/0229343 | A1 | 8/2018 | Kim et al. | |
| 2019/0152016 | A1 * | 5/2019 | Wei ......................... | B24B 49/18 |
| 2020/0035495 | A1 * | 1/2020 | Xu .................... | H01L 21/30625 |
| 2020/0101579 | A1 * | 4/2020 | Suzuki ................... | G06N 3/044 |
| 2020/0130136 | A1 | 4/2020 | Huang et al. | |

FOREIGN PATENT DOCUMENTS

| | | |
|---|---|---|
| TW | 201222907 A | 6/2012 |
| TW | 201336620 A | 9/2013 |
| TW | 202025274 A | 7/2020 |
| TW | 202128350 A | 8/2021 |

* cited by examiner

SEMICONDUCTOR PROCESSING TOOL AND METHODS OF OPERATION

BACKGROUND

A layer, a substrate, or a semiconductor wafer may be planarized using a polishing or planarizing technique such as chemical mechanical polishing/planarization (CMP). A CMP operation may include depositing a slurry (or polishing compound) onto a polishing pad. A semiconductor wafer may be mounted to and secured by a carrier, which may rotate the semiconductor wafer as the semiconductor wafer is pressed against the polishing pad. The slurry and polishing pad act as an abrasive that polishes or planarizes one or more layers (e.g., metallization layers) of the semiconductor wafer as the semiconductor wafer is rotated. The polishing pad may also be rotated to ensure a continuous supply of slurry is applied to the polishing pad.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
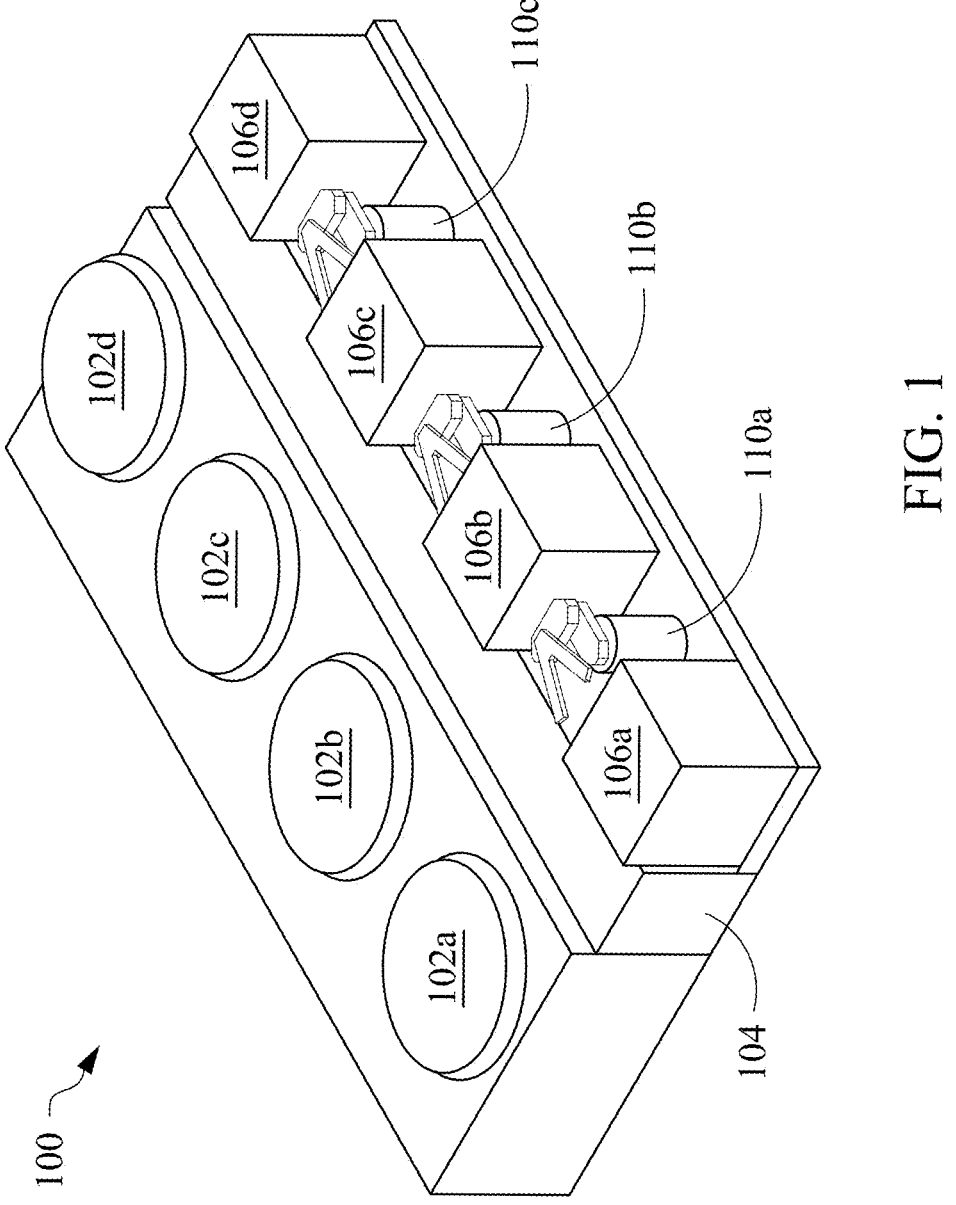
FIG. 1 is a diagram of an example planarization tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, one or more properties of a polishing pad may change over time. For example, roughness and/or uniformity of the polishing pad may decrease as the polishing pad wears from use. Changes in these properties may impact the performance of a planarization tool in that decreased roughness and/or uniformity of the polishing pad may result in unstable material removal rates and/or hot spots on the polishing pad, among other examples. This may lead to reduced quality and repeatability in planarization operations performed by the planarization tool. The reduced quality and repeatability may lead to an increased defect rate for semiconductor dies on a semiconductor wafer that is processed by the planarization tool, may lead to an increased rate of scrapped dies on semiconductor wafers that are processed by the planarization tool, and/or may lead to an increased rate of scrapped semiconductor wafers that are processed by the planarization tool, among other examples.

In some implementations described herein, semiconductor wafers are processed using a planarization tool described herein. The planarization tool includes a polishing head that is configured to support and secure a semiconductor wafer during a planarization operation in which the polishing head presses the semiconductor wafer against a polishing pad that is supported by a platen of the planarization tool.

As described herein, the planarization tool is configured to monitor and analyze the condition of the polishing pad over the life of the polishing pad. A piezoelectric pad monitoring device may be mounted to the polishing head in place of a semiconductor wafer. The piezoelectric pad monitoring device may be pressed against the polishing pad. When pressed against the polishing pad, the piezoelectric pad monitoring device may generate a signal based on a quantity of pad contacts, on the polishing pad, that are in contact with the piezoelectric pad monitoring device. The signal may be provided to a processor of the planarization tool so that the processor may generate, based on the signal, a map of the pad contacts on the polishing pad. The processor may use the map of the pad contacts to determine one or more properties of the polishing pad such as roughness and/or uniformity, among other examples. The processor may identify, modify, or tailor the operation of the planarization tool based on the one or more properties of the polishing pad. Additionally, and/or alternatively, the processor may identify areas of the polishing for maintenance and/or rework based on the one or more properties of the polishing pad.

In this way, the piezoelectric pad monitoring device enables the condition of the polishing pad to be analyzed in a non-destructive way as opposed to removing the polishing pad from the platen and cutting pieces off of the polishing pad for analysis. Thus, the piezoelectric pad monitoring device described herein enables the polishing pad to be used over a longer time duration and a greater quantity of planarization operations while still permitting analysis of the polishing pad, which reduces polishing pad scrap and reduces the quantity of polishing pads used in the planarization tool over the lifetime of the planarization tool.

Moreover, enabling the condition of the polishing pad to be analyzed in a non-destructive way facilitates tuning of process parameters and/or rework of the polishing pad to be performed, which may enable the useful lifetime of the polishing pad to be prolonged. Process parameter tuning and/or rework of the polishing pad may further enable the polishing pad to be used over a longer time duration and a greater quantity of planarization operations, which reduces polishing pad scrap and reduces the quantity of polishing pads used in the planarization tool over the lifetime of the planarization tool.

In addition, process parameter tuning and/or rework of the polishing pad may enable roughness and/or uniformity of the polishing pad to be maintained for a longer time duration than without process parameter tuning and/or rework, which may enable quality and repeatability in planarization operations performed by the planarization tool to be sustained for a greater quantity of planarization operations. This may reduce the defect rate for semiconductor dies on a semiconductor wafer that is processed by the planarization tool, may reduce the rate of scrapped dies on semiconductor wafers that are processed by the planarization tool, and/or may reduce the rate of scrapped semiconductor wafers that are processed by the planarization tool, among other examples.

FIG. 1 is a diagram of an example planarization tool 100 described herein. The planarization tool 100 includes a CMP tool or another type of semiconductor processing tool that is capable of polishing or planarizing a semiconductor wafer, a semiconductor device, and/or another type of semiconductor substrate. The planarization tool 100 includes one or more processing chambers 102 in which layers and/or structures of a semiconductor wafer are polished or planarized. In some implementations, a processing chamber 102 is configured to polish or planarize a surface (or a layer or structure) of a semiconductor wafer with a combination of chemical and mechanical forces (e.g., chemical etching and free abrasive polishing). The planarization tool 100 is configured to utilize an abrasive and corrosive chemical slurry in conjunction with a polishing pad and retaining ring (e.g., typically of a greater diameter than the semiconductor wafer) in a processing chamber 102. To perform a planarization operation (also referred to herein as a CMP operation), the planarization tool 100 presses the polishing pad against the semiconductor wafer in the processing chamber 102 using a dynamic polishing head that is held in place by the retaining ring. The dynamic polishing head may rotate with different axes of rotation to remove material and even out any irregular topography of a layer or a structure of the semiconductor wafer, thereby making the layer or a structure of the semiconductor wafer flat or planar.

The planarization tool 100 includes a transfer chamber 104 in which semiconductor wafers are transferred to and from the processing chamber(s) 102. Moreover, semiconductor wafers are transferred between the transfer chamber 104 and one or more cleaning chambers 106a-106c included in the planarization tool 100. A cleaning chamber (also referred to as a CMP cleaning chamber or a post-CMP cleaning chamber) is a component of the planarization tool 100 that is configured to perform a post-CMP cleaning operation to clean or remove residual slurry and/or removed material from a semiconductor wafer that has undergone a CMP operation. In some implementations, the planarization tool 100 includes a plurality of cleaning chambers 106, and the planarization tool 100 is configured to process a semiconductor wafer through a plurality of sequential post-CMP cleaning operations in the plurality of cleaning chambers 106. As an example, the planarization tool 100 may process a semiconductor wafer in a first post-CMP cleaning operation in a cleaning chamber 106a, may process the semiconductor wafer in a second post-CMP cleaning operation in a cleaning chamber 106b, may process the semiconductor wafer in a third post-CMP cleaning operation in a cleaning chamber 106c, and so on.

A cleaning chamber 106 cleans a semiconductor wafer using a cleaning agent such as isopropyl alcohol (IPA), a chemical solution that includes a plurality of cleaning chemicals, and/or another type of cleaning agent. The planarization tool 100 includes one or more types of cleaning chambers 106. Each type of cleaning chamber 106 is configured to clean a semiconductor wafer using a different type of cleaning device. In some implementations, a cleaning chamber 106 includes a brush-type cleaning chamber. A brush-type cleaning chamber is a cleaning chamber that includes one or more cleaning brushes (or roller brushes) that are configured to spin or rotate to brush-clean a semiconductor wafer. In some implementations, a cleaning chamber 106 includes a pen-type cleaning chamber. A pen-type cleaning chamber is a cleaning chamber that includes a cleaning pen (or cleaning pencil) that is configured to provide fine-tuned and detailed cleaning of a semiconductor substrate.

In some implementations, the cleaning chambers 106 of the planarization tool 100 are arranged such that a semiconductor wafer is first processed in one or more brush-type cleaning chambers (e.g., to remove a large amount of removed material and residual slurry from the semiconductor wafer), and is then processed in a pen-type cleaning chamber (e.g., to provide detailed cleaning of structures and/or recesses in the semiconductor wafer). As an example, the cleaning chambers 106a and 106b may be configured as brush-type cleaning chambers, and cleaning chamber 106c may be configured as a pen-type cleaning chamber.

The planarization tool 100 includes a rinsing chamber 108 that is configured to rinse a semiconductor wafer after one or more post-CMP cleaning operations. The rinsing chamber 108 rinses a semiconductor wafer to remove residual cleaning agent from the semiconductor wafer. The rinsing chamber 108 is configured to use a rinsing agent, such as deionized water (DIW) or another type of rinsing agent, to rinse a semiconductor wafer. Semiconductor wafers are transferred to the rinsing chamber 108 from a cleaning chamber 106 directly or through the transfer chamber 104. In some implementations, a semiconductor wafer is processed in a drying operation in the rinsing chamber 108, in which the semiconductor wafer is dried to prevent oxidation and/or other types of contamination of the semiconductor wafer.

The planarization tool 100 includes a plurality of transport devices 110a-110c. The transport devices include robot arms or other types of transport devices that are configured to transfer semiconductor wafers between the processing chamber(s) 102, the transfer chamber 104, the cleaning chamber(s) 106, and/or the rinsing chamber 108.

As indicated above, FIG. 1 is provided as an example. Other examples may differ from what is described with regard to FIG. 1.

Figure 2A:
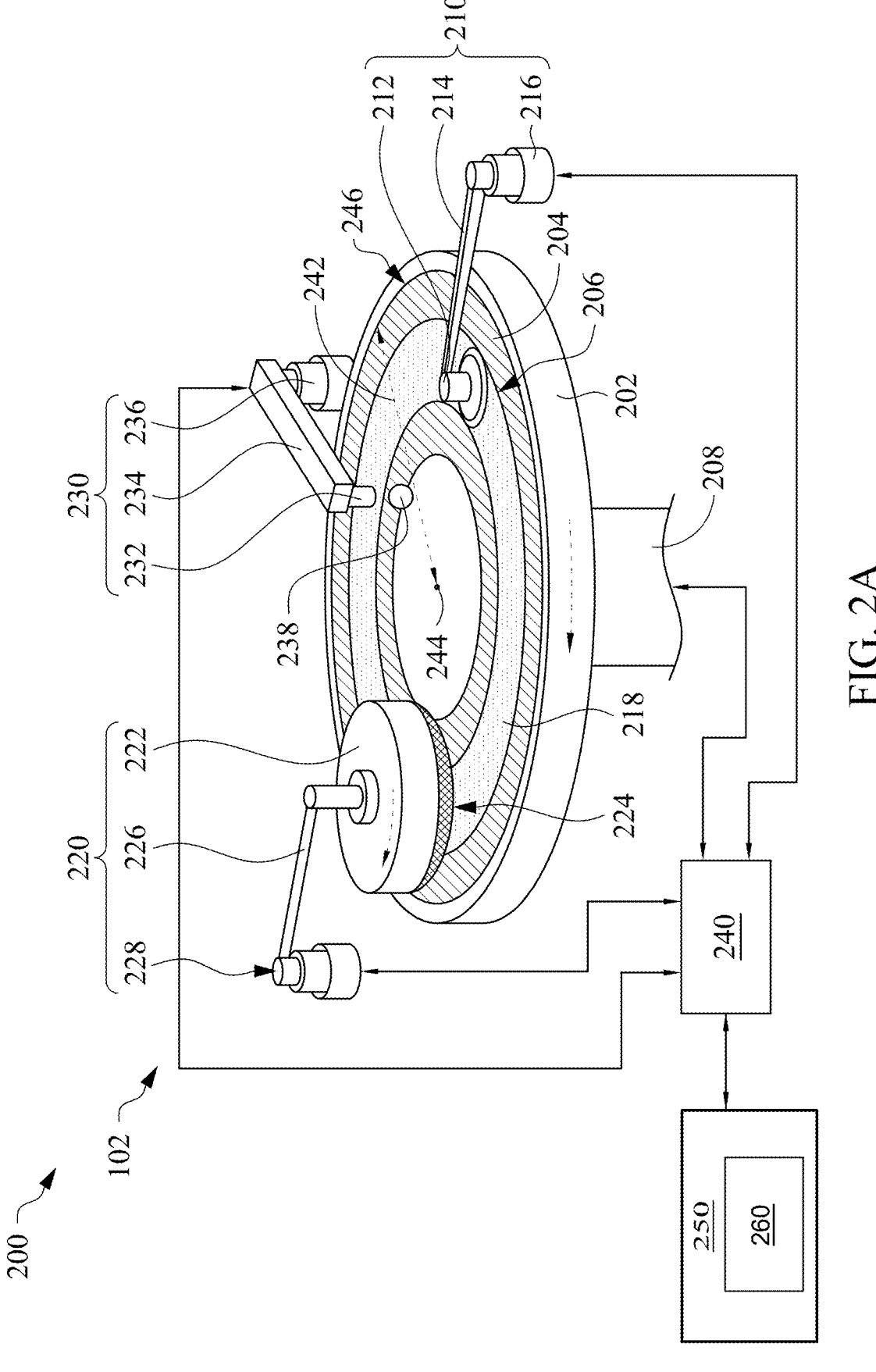
FIGS. 2A-2C are diagrams of example implementations of a processing chamber of the planarization tool described herein.
Figure 2B:
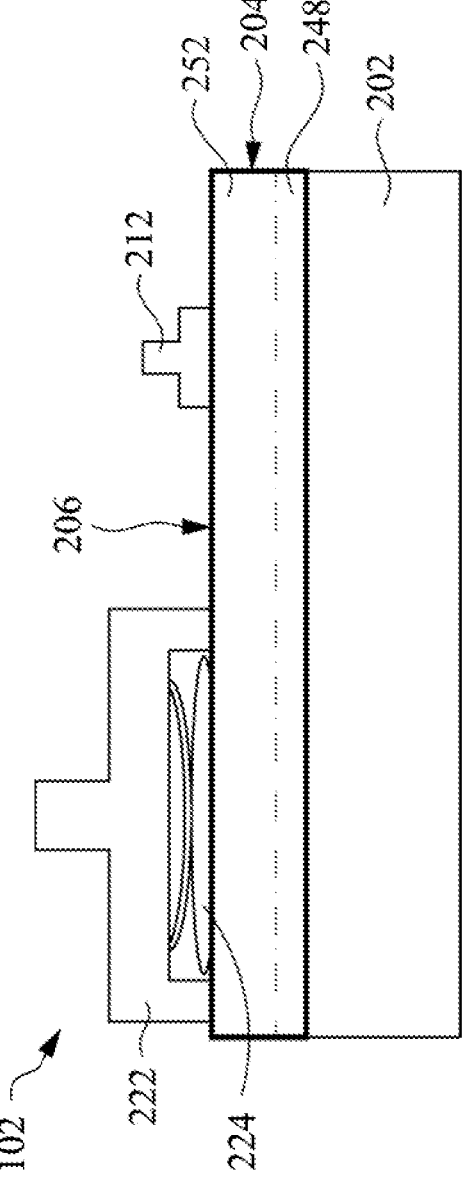
Figure 2C:
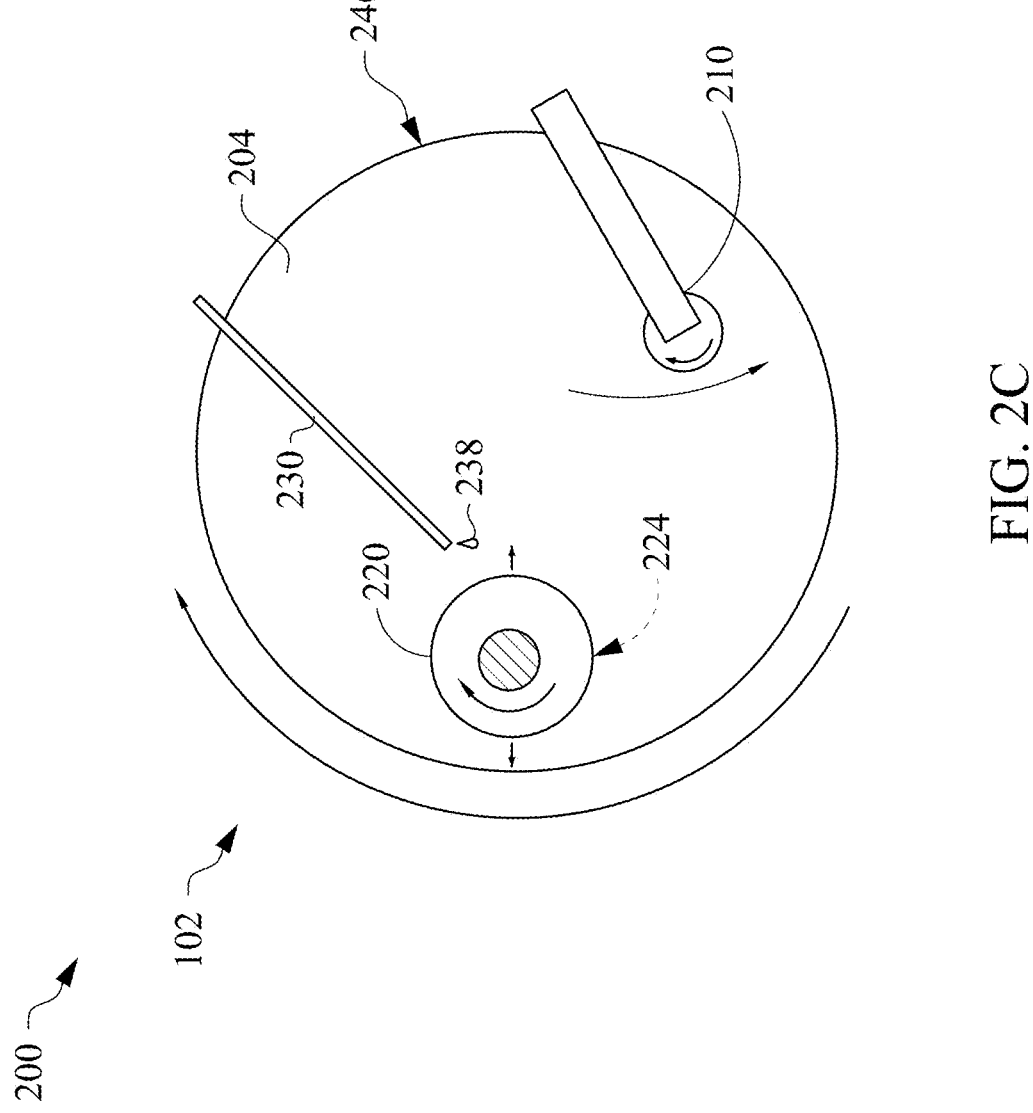

FIGS. 2A-2C are diagrams of example implementations 200 of a processing chamber of the planarization tool 100 described herein. In particular, FIGS. 2A-2C illustrate views inside the processing chamber 102.

FIG. 2A illustrates a perspective view inside the processing chamber 102. As shown in FIG. 2A, the processing chamber 102 includes various subsystems including a conditioner 210, a wafer carrier 220, a slurry system 230, a motor assembly 240, and a CMP controller 250. The processing chamber 102 further includes a rotating platen 202 and a polishing pad 204. The polishing pad 204 is mounted on the rotating platen 202 and has a polishing surface 206. The rotating platen 202 is further coupled to a drive shaft 208.

The conditioner 210 includes a conditioning disk 212 which can be pivoted via an arm 214. The arm 214 is electrically connected to the motor assembly 240 through a shaft 216. The arm 214 is driven by the shaft 216 to move, for example, in a swing motion over a range 218 in a planarization operation (e.g., a CMP operation). Therefore, the conditioning disk 212 travels along the swing motion to condition different portions of the polishing surface 206. The conditioning disk 212 may be configured to rotate about an axis to restore asperities to the polishing surface 206 as the planarization operation makes the polishing surface 206 smoother. That is, in order to retain the material removal qualities of the polishing pad 204, the conditioning disk 212 is used to maintain roughness on the polishing surface 206 that would otherwise be lost during the planarization operation. The conditioning disk 212 carries an abrasive pad that may include, for example, a diamond abrasive.

The wafer carrier 220 includes a polishing head 222 for mounting and securing a semiconductor wafer 224. The semiconductor wafer 224 may be mounted and secured to the polishing head 222 by a vacuum force or another type of securing force. The semiconductor wafer 224 is mounted to the polishing head 222 such that a surface of the semiconductor wafer 224 (e.g., a polishing surface, a processing surface, an active surface, a device surface) that is to be processed is orientated to face the polishing surface 206. The polishing head 222 may also be pivoted via an arm 226. The arm 226 is electrically connected to the motor assembly 240 through a shaft 228. In some implementations, the arm 226 may also be driven by the shaft 228 to move in a swing motion during the planarization operation. The polishing head 222 is configured to rotate about an axis of the polishing head 222 (e.g., an axis that is approximately perpendicular to the polishing surface 206) in the planarization operation.

The slurry system 230 includes a slurry supply 232 which can be pivoted via an arm 234. The arm 234 is electrically connected to the motor assembly 240 through a shaft 236. In some implementations, the arm 234 may also be driven by the shaft 236 to move in a swing motion in the planarization operation. The slurry system 230 can provide slurry 238 which may include an abrasive compound and a fluid such as deionized water, or a liquid cleaner such as potassium hydroxide (KOH), onto the polishing surface 206 of the polishing pad 204 before wafer planarization occurs. In an example, a flow rate of the slurry 238 may be in a range of approximately 50 milliliters (ml)/minute to approximately 350 ml/minute. However, other values for the range are within the scope of the present disclosure.

In the planarization operation, the motor assembly 240 rotates the platen 202 and the polishing pad 204 via the drive shaft 208. The slurry system 230 dispenses the slurry 238 onto the polishing surface 206. As the polishing pad 204 rotates, the conditioning disk 212 is rotated about a disk axis of the conditioning disk 212 and is driven to swing horizontally above the polishing surface 206 such that the conditioning disk 212 can condition the polishing surface 206 of the polishing pad 204. In some implementations, the conditioning disk 212 iteratively conditions the inner portions and the outer portions of the polishing surface 206. The motor assembly 240 also rotates a semiconductor wafer 224, mounted and secured by the wafer carrier 220, through the arm 226 and the shaft 228. A down-force is controlled by the CMP controller 250 to move the active surface of the semiconductor wafer 224 onto the polishing surface 206. In this configuration, the conditioning disk 212 scratches or roughs up the polishing surface 206 of the polishing pad 204 continuously during the CMP process to promote consistent uniform planarization. The combination of motions of the conditioner 210, the wafer carrier 220, and the slurry system 230 planarizes the active surface of the semiconductor wafer 224 until an endpoint for the CMP process is reached, which may include a particular time duration of the CMP process, a particular amount of material removed from the semiconductor wafer 224, or another endpoint.

In some implementations, the polishing surface 206 includes a plurality of groove segments and/or geometric patterns formed by the plurality of groove segments configured in a groove region 242 of the polishing pad 204. During the CMP process, all or a portion of the plurality of groove segments and/or geometric patterns formed by the plurality of groove segments impede a trajectory of the slurry (hereinafter referred to as a slurry trajectory). Specifically, all or a portion of the plurality of groove segments and/or geometric patterns formed by the plurality of groove segments are configured to impede a radial flow of the slurry 238 from a center 244 of the polishing pad 204 (or from an area of the polishing pad 204 in which the slurry 238 is dispensed) to a polishing pad outer edge 246. Impeding the slurry trajectory promotes retention of the slurry 238 on the polishing surface 206 of the polishing pad 204. By impeding the slurry trajectory, a retention time or duration of time the slurry is present on the polishing pad is increased. Increasing the retention of the slurry results in a more predictable and controlled CMP process and reduces slurry waste.

In some implementations, the slurry 238 is dispensed onto the groove region 242 of the polishing pad 204. The rotation of the polishing pad 204 creates forces that direct the slurry 238 toward the polishing pad outer edge 246. The geometric patterns formed by the plurality of groove segments in the groove region 242 of the polishing pad 204 alters the slurry trajectory across the polishing pad 204. As described herein, all or a portion of the plurality of groove segments and/or geometric patterns formed by the plurality of groove segments are configured to increase a retention time or duration of time the slurry 238 is present on the polishing pad 204.

FIG. 2B is a cross-sectional view inside the processing chamber 102 described herein. As shown in FIG. 2B, the polishing pad 204 may include a pad base 248 and a groove layer 252. In some implementations, groove layer 252 may be supported by the pad base 248, which may be formed integrally with groove layer 252 or may be formed separately from the groove layer 252. The polishing pad 204 may have a circular disk shape with the polishing surface 206 formed thereon. The groove layer 252 includes the polishing surface 206 thereon. The groove layer 252 may be formed from any material suitable for polishing an article to be polished, such as a semiconductor wafer 224. Examples of materials for polishing groove layer 252 include various polymer plastics, such as a polyurethane, polybutadiene, polycarbonate and polymethylacrylate, among other examples.

FIG. 2C is a diagram of an example planarization operation performed in the processing chamber 102. In some implementations, the wafer carrier 220 mounts and secures the semiconductor wafer 224. The slurry system 230 applies the slurry 238 to the polishing pad 204. The conditioner 210 spreads the slurry 238 across the polishing pad 204 while the polishing pad 204 is in motion. In the planarization operation, the polishing pad 204 and the wafer carrier 220 rotate and/or oscillate to perform a planarization of the semiconductor wafer 224. The planarization operation removes an amount, for example the excess thickness, of a layer on the semiconductor wafer 224. The planarization operation includes dispensing the slurry 238 onto the polishing pad 204, and rotating the polishing pad 204, where rotation of the polishing pad 204 results in a slurry trajectory of the slurry 238 radially outward toward the polishing pad outer edge 246 of the polishing pad 204.

In some implementations, the planarization operation may be performed based on one or more parameters. The one or more parameters may include, for example, a rotational velocity of the polishing head 222 (also referred to as the disk sweep profile), a revolutions per minute (RPM) of the polishing head 222, a downward force (or pressure) of the semiconductor wafer 224 against the polishing pad 204 (also referred to as the dressing down force), a time duration for the planarization operation, a rotational velocity of the polishing pad 204, an RPM of the polishing pad 204, a polishing path along which the semiconductor wafer 224 traverses the polishing pad 204 in the planarization operation, and/or another parameter. As described herein, the one or more parameters of the planarization operation may be based on a pad contact map, for the polishing pad 204, that was generated using a piezoelectric pad monitoring device described herein.

In some implementations, different parameter sets (that each includes one or more parameters) may be used for different regions of the polishing pad 204. For example, one or more first parameters may be used for planarizing a layer of the semiconductor wafer 224 in a first region of the polishing pad 204 in the planarization operation, and one or more second parameters may be used for planarizing the layer of the semiconductor wafer 224 in a second region of the polishing pad 204 in the planarization operation. The one or more first parameters and the one or more second parameters may be based on an analysis, of pad contacts on the polishing pad 204, that was performed using a piezoelectric pad monitoring device described herein.

As indicated above, FIGS. 2A-2C are provided as examples. Other examples may differ from what is described with regard to FIGS. 2A-2C.

Figure 3A:
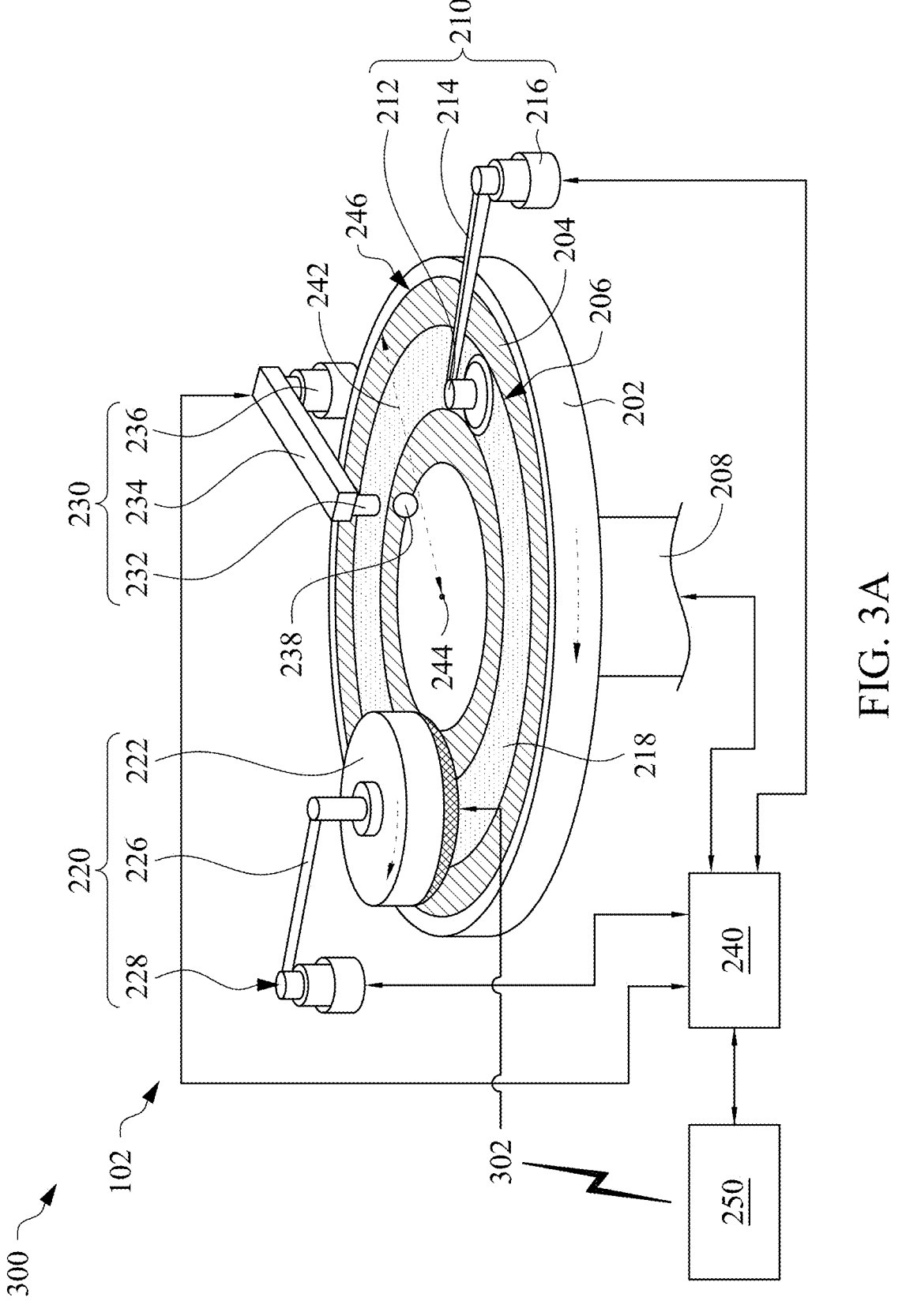
FIGS. 3A and 3B are diagrams of an example implementation of a piezoelectric pad monitoring device for use in the planarization tool described herein.
Figure 3B:
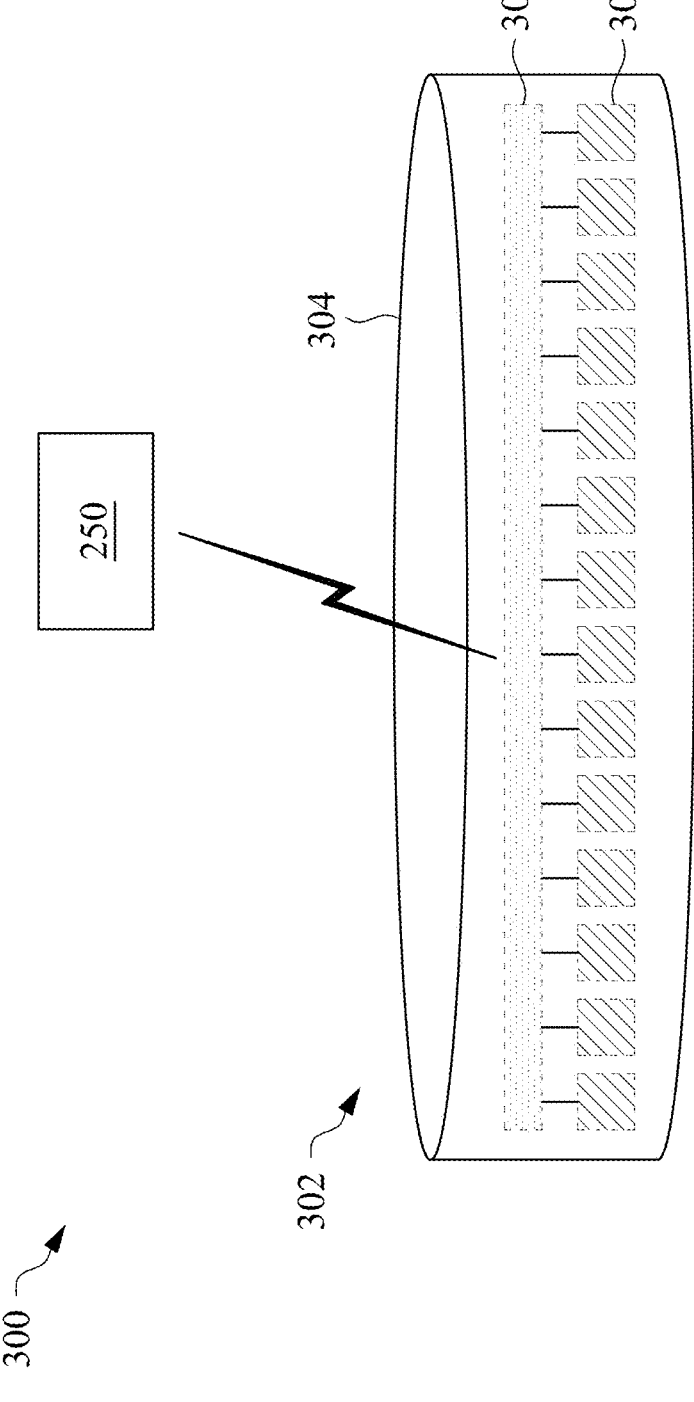

FIGS. 3A and 3B are diagrams of an example implementation 300 of a piezoelectric pad monitoring device 302 for use in the planarization tool 100 described herein. The piezoelectric pad monitoring device 302 may be configured to generate a signal that may be used to determine properties of the polishing pad 204 such as roughness and/or uniformity, among other examples. In this way, the CMP controller 250 may modify or tailor the operation of the planarization tool 100 based on the one or more properties of the polishing pad 204.

FIG. 3A illustrates a view inside of a processing chamber 102 of the planarization tool 100. As shown in FIG. 3A, the piezoelectric pad monitoring device 302 may be configured to be mounted, attached, and/or otherwise secured to the polishing head 222 in the processing chamber 102 of the planarization tool 100. The piezoelectric pad monitoring device 302 may be sized and/or shaped approximately similar to a semiconductor wafer 224 to provide compatibility with the polishing head 222. However, other shapes and/or sizes for the piezoelectric pad monitoring device 302 are within the scope of the present disclosure.

The wafer carrier 220 may be configured to use the arm 226 and the shaft 228 to press the piezoelectric pad monitoring device 302 against the surface of the polishing pad 204. The piezoelectric pad monitoring device 302 may be configured to generate a signal (e.g., a voltage, a current, a capacitance, a resistance) that is transmitted as a wired and/or wireless communication to the CMP controller 250. The signal may be based on results of one or more measurements that are performed by the piezoelectric pad monitoring device 302 while the piezoelectric pad monitoring device 302 is pressed against the polishing pad 204.

In some implementations, the polishing pad 204 remains stationary while the piezoelectric pad monitoring device 302 performs measurement(s) of the polishing pad 204. In some implementations, the wafer carrier 220 uses the arm 226 and/or the shaft 228 to move the piezoelectric pad monitoring device 302 across the surface of the polishing pad 204 while the piezoelectric pad monitoring device 302 performs measurement(s) of the polishing pad 204.

In some implementations, the polishing pad 204 is continuously or incrementally rotated so that the piezoelectric pad monitoring device 302 may perform measurement(s) across the entire polishing pad 204. For example, the wafer carrier 220 may sweep the piezoelectric pad monitoring device 302 across a first section of the polishing pad 204 while measurement(s) are performed, and the polishing pad 204 may be subsequently rotated such that the piezoelectric pad monitoring device 302 may perform measurement(s) across a second section of the polishing pad 204, and so on in a similar manner.

As shown in FIG. 3B, the piezoelectric pad monitoring device 302 may include a body 304. The body 304 may be sized and/or shaped approximately similar to a semiconductor wafer 224 to provide compatibility with the polishing head 222. However, other shapes and/or sizes for the body 304 are within the scope of the present disclosure.

The piezoelectric pad monitoring device 302 may include one or more one or more piezoelectric sensing regions 306 included in the body 304. The piezoelectric pad monitoring device 302 may also include a processor 308 included in the body 304. The processor 308 may be communicatively coupled with the one or more piezoelectric sensing regions 306 (e.g., by conductive traces, by wires).

Each piezoelectric sensing region 306 may be configured to generate a signal and to provide the signal to the processor 308. For example, a piezoelectric sensing region 306 may be configured to generate a voltage signal based on stresses induced in the body 304 of the piezoelectric pad monitoring device 302 as a result of the body 304 of the piezoelectric pad monitoring device 302 being pressed against the polishing pad 204. The piezoelectric sensing region 306 may be configured to provide the voltage signal to the processor 308. The piezoelectric sensing region(s) 306 may include one or more types of piezoelectric material, such as aluminum nitride (AlN), zinc oxide (ZnO), and/or lead zirconate titanate (PZT), among other examples.

The processor 308 may be configured to receive the signal from the piezoelectric sensing region(s) 306. The processor 308 may be further configured to transmit the signal to the CMP controller 250 of the planarization tool 100. In some implementations, the processor 308 transmits an indication of the signal (e.g., an indication of the voltage) that is received from a piezoelectric sensing region 306. The processor 308 may transmit the indication in a communication on a wired and/or wireless communication interface. In some implementations, the processor 308 is configured to perform analog to digital conversion of the signal received from a piezoelectric sensing region 306. In these implementations, the processor 308 may transmit a digital communication to the CMP controller 250. In some implementations, the processor 308 streams the signal, received from a piezoelectric sensing region 306, to the CMP controller 250 (e.g., transmits the signal in real time upon receipt of the signal from the piezoelectric sensing region 360.

As indicated above, FIGS. 3A and 3B are provided as examples. Other examples may differ from what is described with regard to FIGS. 3A and 3B.

Figure 4:
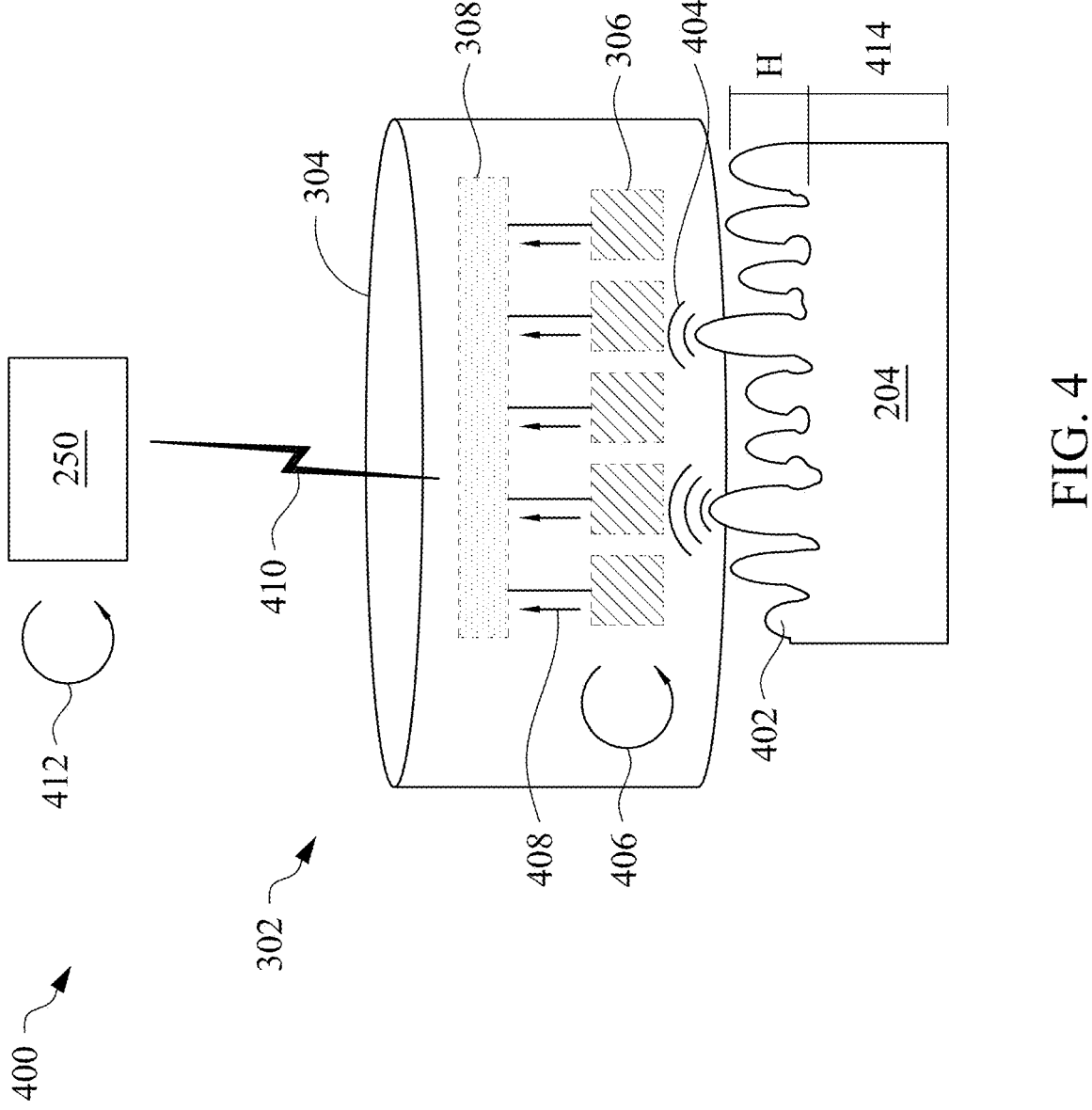
FIG. 4 is a diagram of an example implementation of a pad analysis operation for performing a measurement of a polishing pad using the piezoelectric pad monitoring device described herein.

FIG. 4 is a diagram of an example implementation 400 of a pad analysis operation for performing a measurement of a polishing pad 204 using the piezoelectric pad monitoring device 302 described herein. The pad analysis operation may be performed by the piezoelectric pad monitoring device 302 and the CMP controller 250 to determine a quantity of pad contacts 402 on the polishing pad 204, and to determine one or more parameters for a planarization operation that is to be performed by the planarization tool 100 to planarize a layer on a semiconductor wafer 224.

As shown in FIG. 4, the body 304 of the piezoelectric pad monitoring device 302 may be pressed against the polishing pad 204 (e.g., by the polishing head 222). When the body 304 is pressed against the polishing pad 204, the downward force of the piezoelectric pad monitoring device 302 against the polishing pad 204 causes stresses 404 (e.g., mechanical stresses) to be induced in the body 304 of the piezoelectric pad monitoring device 302. The stresses 404 propagate through the body 304 and to the piezoelectric sensing region(s) 306.

At 406, a piezoelectric sensing region 306 generates a signal 408 (e.g., a voltage signal, a current signal) that is based on the stresses 404 induced in the body 304 of the piezoelectric pad monitoring device 302. As an example, a piezoelectric sensing region 306 may generate a voltage signal as the signal 408, where a magnitude of the voltage signal is based on (e.g., proportional to) the magnitude of the stresses 404 exerted on the piezoelectric sensing region 306. The piezoelectric sensing region 306 may provide the signal 408 to the processor 308 as a result of a measurement of the polishing pad 204, and the processor 308 may transmit a communication 410 indicating the result of the measurement to the CMP controller 250.

At 412, the CMP controller 250 may determine a quantity of pad contacts 402 on the polishing pad 204 based on results of measurements received from the processor 308. The pad contacts 402 include bumps, members, napping (e.g., raised surface portions), and/or other areas of the polishing pad 204 that extend from a base 414 of the polishing pad 204. When the polishing pad 204 is new and unused, the pad contacts 402 may satisfy a particular height threshold. In other words, the polishing pad 204 may be manufactured such that the pad contacts 402 have a minimum height. After the polishing pad 204 is used, the height H of one or more pad contacts 402 may decrease due to wearing of the polishing pad 204 over the life of the polishing pad 204. The CMP controller 250 may determine (or may be provided with) a height threshold for determining whether a pad contact 402 is to be counted among the quantity of pad contacts 402 on the polishing pad 204. If the height H of a pad contact 402 does not satisfy the height threshold, the CMP controller 250 does not count the pad contact 402 among the quantity of pad contacts 402 on the polishing pad 204. If the height H of a pad contact 402 satisfies the height threshold, the CMP controller 250 counts the pad contact 402 among the quantity of pad contacts 402 on the polishing pad 204.

The height threshold may correspond to a height at which a pad contact 402 is estimated to no longer provide planarization for (or contact) a semiconductor wafer 224 in a planarization operation. The height threshold may be determined based on a downward pressure for the planarization operation, a pad hardness of the polishing pad 204, a material of the polishing pad 204, and/or another parameter. For example, a polishing pad 204 having a greater pad hardness may include pad contacts 402 having a greater average height H (e.g., approximately 1.3 millimeters or another height) relative to an average height H of pad contacts 402 on a polishing pad 204 having a lesser pad hardness (e.g., approximately 0.8 millimeters or another height).

The voltage signal indicated in the results of measurements received from the processor 308, may be based on a quantity of the pad contacts 402 of the polishing pad 204 that are in contact with the body 304 of the piezoelectric pad monitoring device 302. For example, a greater quantity of pad contacts 402 in contact with the body 304 of the piezoelectric pad monitoring device 302 may exert a greater magnitude of stresses 404 on the piezoelectric sensing region(s) 306, which in turn may cause the piezoelectric sensing region(s) 306 to generate a higher magnitude voltage signal relative to a lesser quantity of pad contacts 402 in contact with the body 304 of the piezoelectric pad monitoring device 302.

In some implementations, the CMP controller 250 determines the quantity of pad contacts 402 on the polishing pad 204 based on the magnitude of a voltage signal (e.g., the signal 408) indicated in the results of measurements received from the processor 308. For example, a first magnitude may correspond to a first quantity of pad contacts 402, a second magnitude may correspond to a second quantity of pad contacts 402, and so on.

In some implementations, the CMP controller 250 determines the quantity of pad contacts 402 on the polishing pad 204 based on ranges for the magnitude of a voltage signal (e.g., the signal 408). For example, if the CMP controller 250 determines that the magnitude is within a first magnitude range, the CMP controller 250 may determine a first quantity of pad contacts 402 corresponding to the first magnitude range; if the CMP controller 250 determines that the magnitude is within a second magnitude range, the CMP controller 250 may determine a second quantity of pad contacts 402 corresponding to the second magnitude range; and so on.

The CMP controller 250 may determine one or more parameters for a planarization operation, that is to be performed by the planarization tool 100 to planarize a layer on a semiconductor wafer 224, based on the quantity of pad contacts 402 determined at 412. For example, the CMP controller 250 may determine, based on the quantity of pad contacts 402 on the polishing pad 204, a rotational velocity of the semiconductor wafer 224, a downward force that is used to press the semiconductor wafer 224 against the polishing pad 204, a polishing path along which the semiconductor wafer 224 is to traverse in the planarization operation, and/or a time duration of the planarization operation, among other examples.

As the polishing pad 204 wears from use in one or more planarization operations, the quantity of pad contacts 402 on the polishing pad 204 determined by the CMP controller 250 may decrease as pad contacts 402 are worn down. The CMP controller 250 may increase the downward force, may increase the rotational velocity, and/or may increase the time duration, among other examples, to compensate for decreases in the quantity of pad contacts 402 over the life of the polishing pad 204. In this way, the CMP controller 250 may tune the parameters of the planarization tool 100 to maintain a consistent and uniform polishing rate for the polishing pad 204 over the life of the polishing pad 204. In some implementations, the CMP controller 250 generates a pad contact map for the polishing pad 204 based on the quantity of pad contacts 402, as described in connection with FIGS. 6A-6F.

Additionally, and/or alternatively, the CMP controller 250 may initiate repair operations and/or pad dressing operations (break-in operations) to rework the polishing pad 204 based on the quantity of pad contacts 402 on the polishing pad 204. In some implementations, the CMP controller 250 may provide an indication on a display of the planarization tool 100 that the polishing pad 204 is to be replaced based on determining that the quantity of pad contacts 402 does not satisfy a threshold quantity.

As indicated above, FIG. 4 is provided as an example. Other examples may differ from what is described with regard to FIG. 4.

Figure 5B:
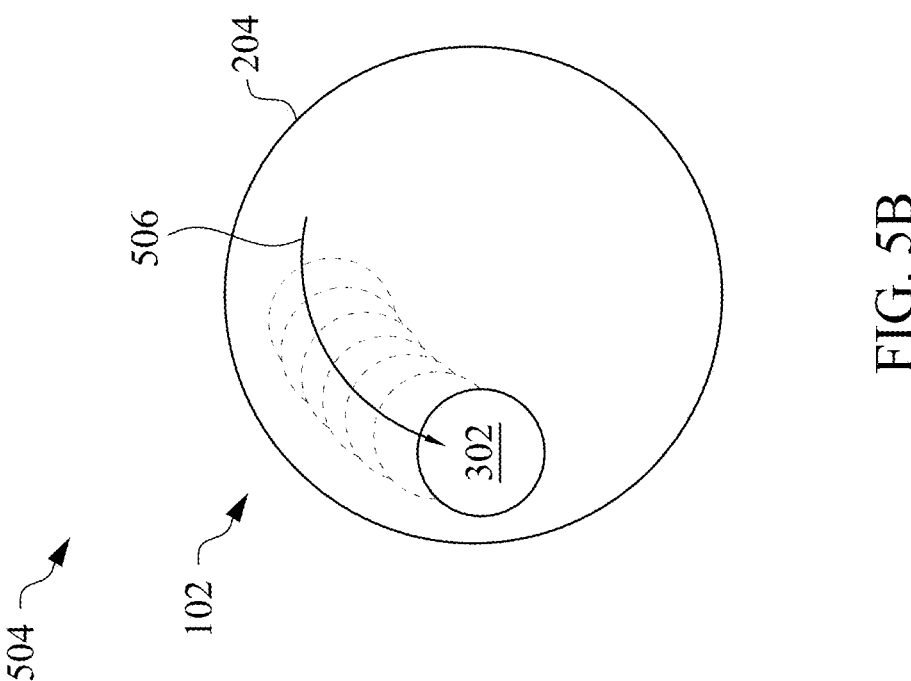
FIGS. 5A and 5B are diagrams of example implementations of polishing pad measurement techniques for using the piezoelectric pad monitoring device described herein to perform measurements of a polishing pad.
Figure 5A:
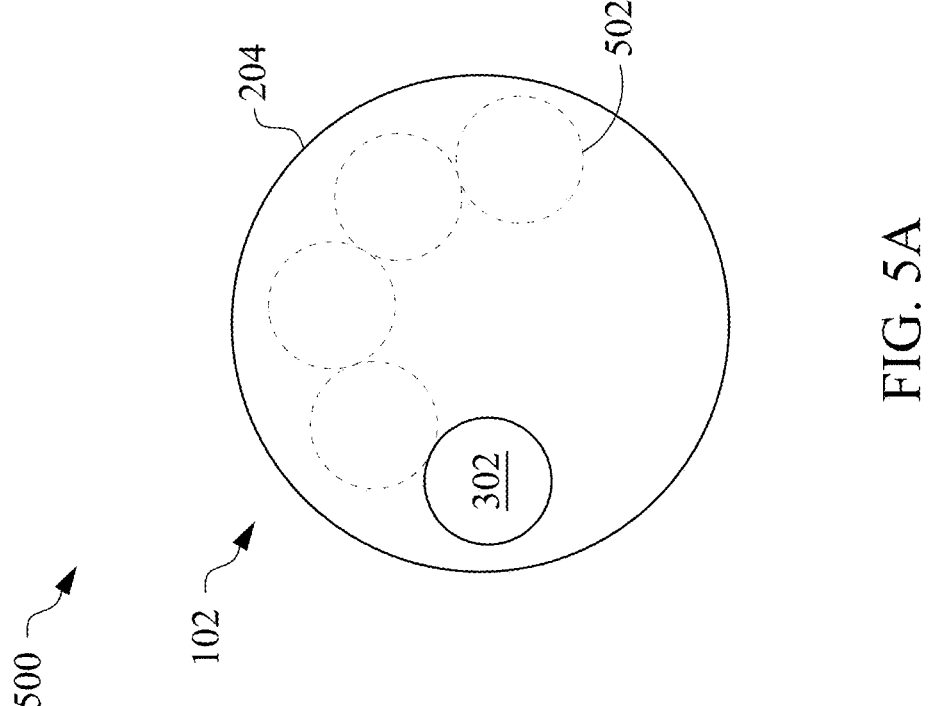

FIGS. 5A and 5B are diagrams of example implementations of polishing pad measurement techniques for using the piezoelectric pad monitoring device 302 described herein to perform measurements of a polishing pad 204. In some implementations, the example implementations of polishing pad measurement techniques described in connection with FIGS. 5A and 5B may be used together in a pad analysis operation (e.g., sequentially, with one technique being performed first followed by another technique). In some implementations, one of the polishing pad measurement techniques described in connection with FIGS. 5A and 5B may be selected for a pad analysis operation.

As shown in FIG. 5A, an example implementation 500 of a polishing pad measurement technique includes using the wafer carrier 220 to move the piezoelectric pad monitoring device 302 along the polishing pad 204 in a pad analysis operation such that measurements (e.g., voltage measurements, current measurements) are performed in non-overlapping regions 502 of the polishing pad 204. Additionally, and/or alternatively, the polishing pad 204 is rotated to enable the piezoelectric pad monitoring device 302 to perform the measurements in the non-overlapping regions 502 of the polishing pad.

As shown in FIG. 5B, another example implementation 504 of a polishing pad measurement technique includes using the wafer carrier 220 to move the piezoelectric pad monitoring device 302 along a movement path 506. The piezoelectric pad monitoring device 302 may continuously perform measurements (e.g., voltage measurements, current measurements) as the piezoelectric pad monitoring device 302 is moved along the movement path 506. Additionally, and/or alternatively, the polishing pad 204 is rotated to enable the piezoelectric pad monitoring device 302 to continuously perform the measurements along the movement path 506.

Continuously performing the measurements as the piezoelectric pad monitoring device 302 is moved along the movement path 506 according to the example implementation 504 may provide increased measurement points and increased measurement coverage on the polishing pad 204 relative to the example implementation 500. Alternatively, performing the measurements in the non-overlapping regions 502 according to the example implementation 500 may result in a reduced pad analysis operation duration relative to the example implementation 504.

As indicated above, FIGS. 5A and 5B are provided as examples. Other examples may differ from what is described with regard to FIGS. 5A and 5B.

FIGS. 6A-6F are diagrams of an example implementation 600 described herein. The example implementation 600 may include an example of using the piezoelectric pad monitoring device 302 to tune parameters for a planarization operation that is performed by the planarization tool 100 to planarize a layer on a semiconductor wafer 224.

Figure 6A:
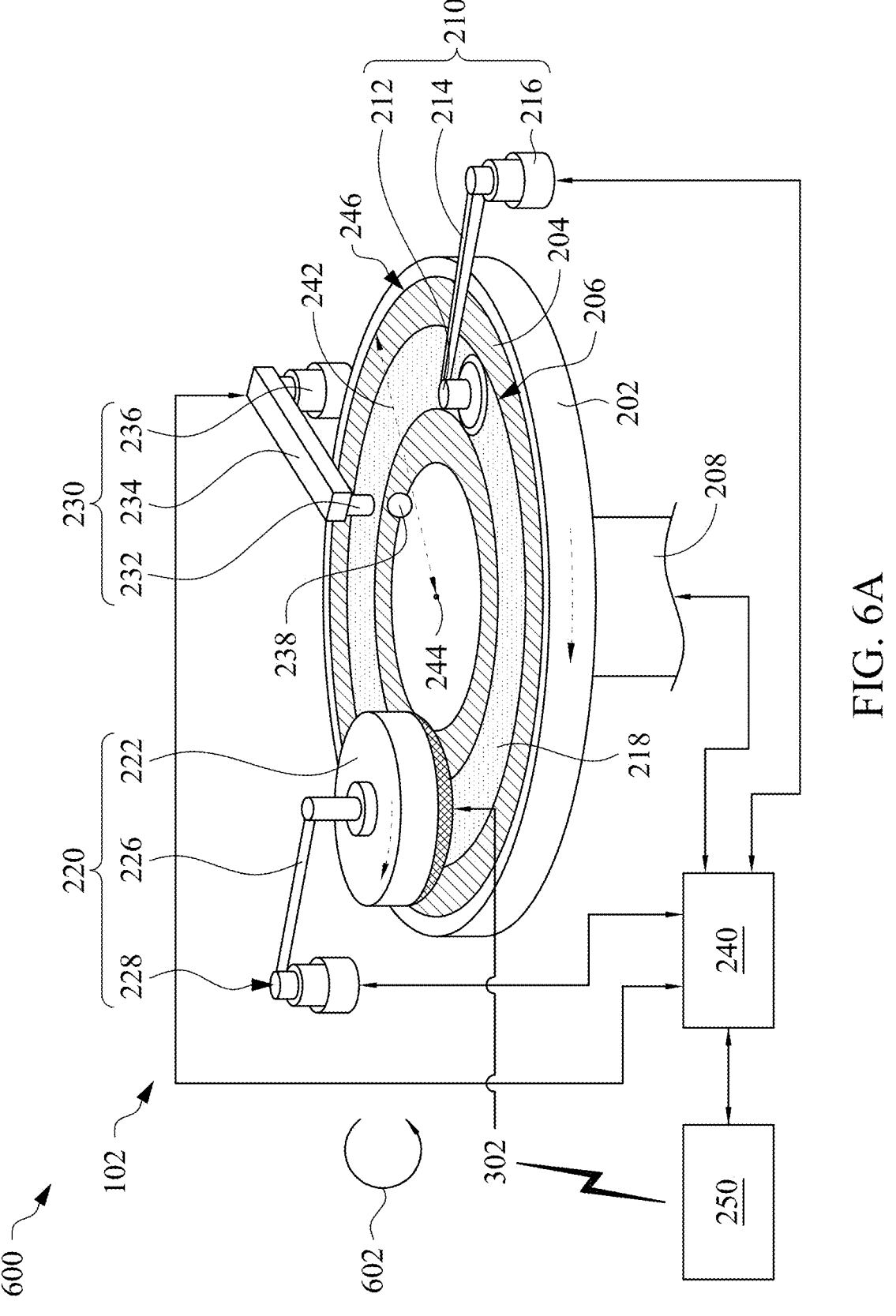
FIGS. 6A-6F are diagrams of an example implementation described herein.
Figure 6B:
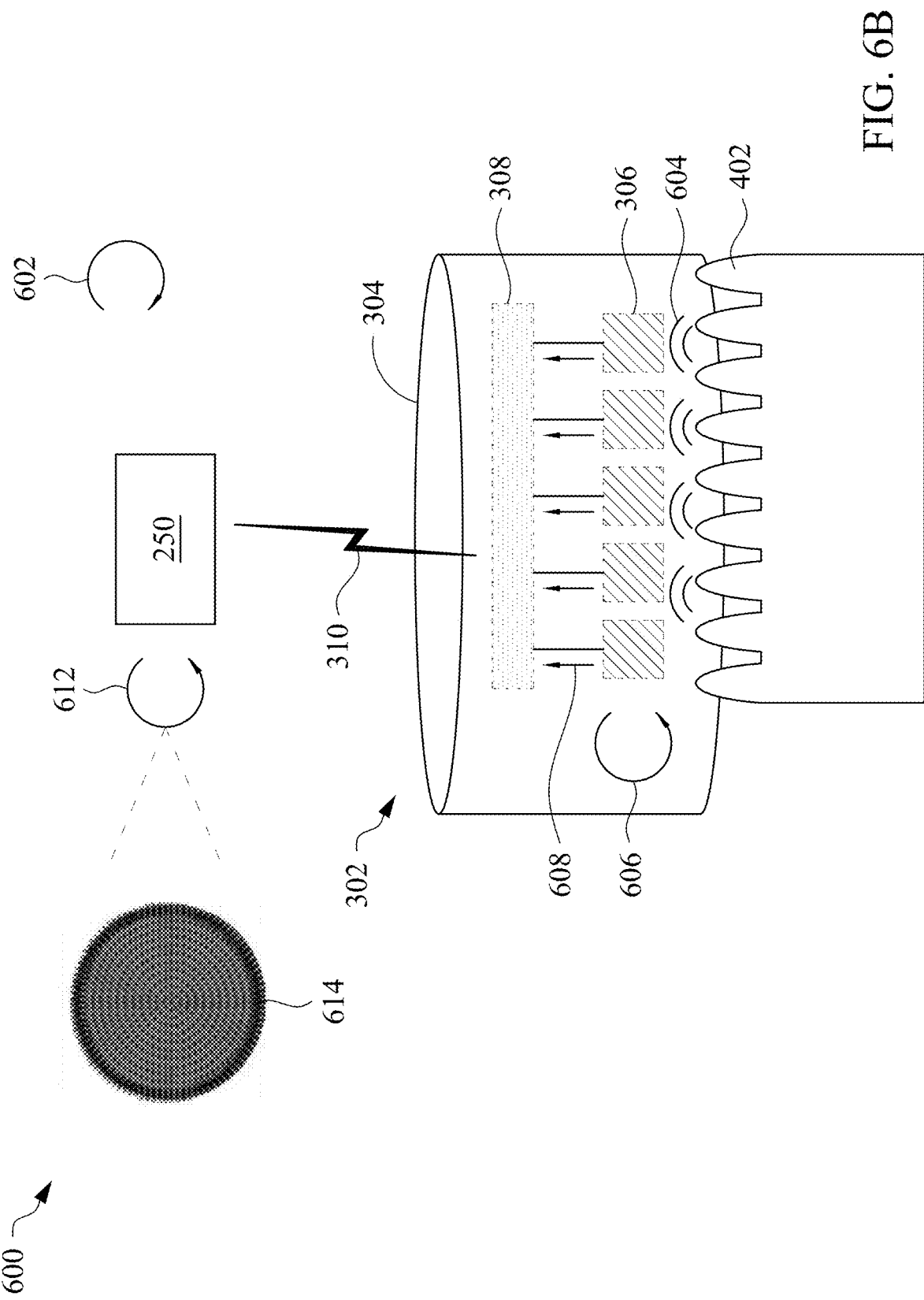

As shown in FIGS. 6A and 6B, a pad analysis operation 602 may be performed for the polishing pad 204 of the planarization tool 100. The pad analysis operation 602 may include securing the piezoelectric pad monitoring device 302 to the polishing head 222 of the planarization tool 100 and establishing a communication connection between the piezoelectric pad monitoring device 302 and the CMP controller 250, as shown in FIG. 6A.

As shown in FIG. 6B, in the pad analysis operation 602, the piezoelectric pad monitoring device 302 may be pressed against the surface of the polishing pad 204 such that the pad contacts 402 of the polishing pad 204 are in contact with the body 304 of the piezoelectric pad monitoring device 302. The CMP controller 250 may transmit a signal to the motor assembly 240, which causes the motor assembly 240 to control the wafer carrier 220 such that the wafer carrier 220 applies a downward force to press the piezoelectric pad monitoring device 302 against the polishing pad 204. The CMP controller 250 may determine the magnitude of the downward force based on a hardness of the polishing pad 204, based on material of the polishing pad 204, and/or based on another parameter of the polishing pad 204. For example, the CMP controller 250 may determine, based on the hardness of the polishing pad 204, a magnitude for the downward force such that the piezoelectric pad monitoring device 302 makes a sufficient amount of contact with the pad contacts 402 without fully depressing the pad contacts 402 (which might otherwise cause an error reading from the piezoelectric pad monitoring device 302).

As further shown in FIG. 6B, the downward force of the piezoelectric pad monitoring device 302 against the pad contacts 402 of the polishing pad 204 causes stresses 604 to be induced in the body 304 of the piezoelectric pad monitoring device 302. The stresses 604 are exerted on the piezoelectric sensing region(s) 306. At 606, the stresses 604 cause the piezoelectric sensing region(s) 306 to generate a signal 608 (e.g., a voltage signal, a current signal) that is provided to the processor 308. The processor 308 receives the signal 608 and transmits a communication 610 to the CMP controller 250 indicating results of one or more measurements of the signal 608. The CMP controller 250 may receive the communication 610 and may determine a quantity of pad contacts 402 for the polishing pad 204 based on the results of the one or more measurements. The CMP controller 250 may determine the quantity of pad contacts 402 using one or more techniques described in connection with FIG. 4 and/or elsewhere herein.

The piezoelectric pad monitoring device 302 may be moved around the surface of the polishing pad 204 such that measurements and quantities of pad contacts 402 may be determined for other regions of the polishing pad 204. At 612, the CMP controller 250 may generate a pad contact map 614 based on the quantities of pad contacts 402 determined based on the measurements in the regions of the polishing pad 204. The pad contact map 614 may include a representation of the locations of the pad contacts 402 on the polishing pad 204. In some implementations, the pad contact map 614 may include a visual/graphical representation that can be displayed on a display of the planarization tool 100. The CMP controller 250 may index the pad contacts 402 based on the measurements performed by the piezoelectric pad monitoring device 302, and may determine the locations of the pad contacts 402 in the pad contact map 614 based on indexing the pad contacts 402.

The pad analysis operation 602 may be performed prior to use of the polishing pad 204 in a planarization operation in the planarization tool 100. This enables the CMP controller 250 to generate the pad contact map 614 as a "golden" map that serves as a baseline of the condition of the pad contacts 402 on the polishing pad 204 prior to use of the polishing pad 204. The pad contact map 614 enables the CMP controller 250 to track the wearing of the pad contacts 402 on the polishing pad 204 as the polishing pad 204 is used in planarization operations. This enables the CMP controller 250 to identify trends in wear rates and wear patterns, for example, across the surface of the polishing pad 204. Moreover, this enables the CMP controller 250 to estimate times or intervals for when maintenance and/or rework of the polishing pad 204 is to be performed, and/or to estimate when to adjust parameters of a planarization operation to account for wearing of the pad contacts 402 on the polishing pad 204.

Figure 6C:
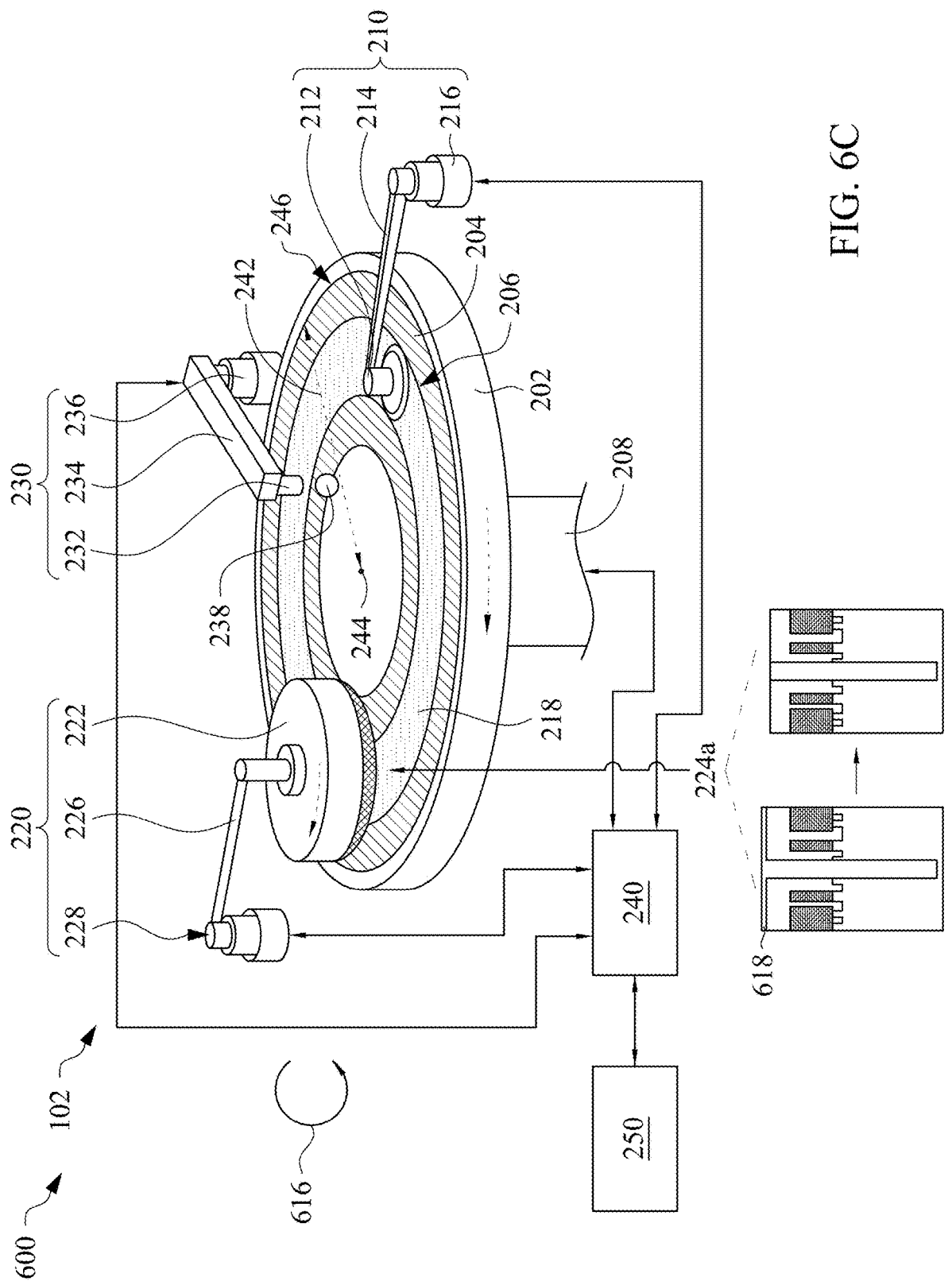

As shown in FIG. 6C, a planarization operation 616 may be performed to planarize a layer 618 on a semiconductor wafer 224a. The layer 618 may include a metallization layer and/or another type of layer. For example, the layer 618 may include a via, a plug, a contact, a trench, a through silicon via (TSV), a through insulator via (TIV), and/or another type of metallization layer. In some implementations, the planarization operation 616 may be performed to remove excess material from the layer 618. In some implementations, the planarization operation 616 may be performed to increase the uniformity of the top surface of the layer 618.

The planarization operation 616 may include securing the semiconductor wafer 224a to the polishing head 222 in the processing chamber 102 of the planarization tool 100. The planarization operation 616 may include pressing, using the polishing head 222, the semiconductor wafer 224a against the polishing pad 204 in the processing chamber 102 to planarize the layer 618 on the semiconductor wafer 224a.

The CMP controller 250 may determine one or more parameters for the planarization operation 616. The CMP controller 250 may determine the one or more parameters for the planarization operation 616 based on the pad contact map 614 for the polishing pad 204 that was generated as part of the pad analysis operation 602. Alternatively, the one or more parameters may be selected as default/baseline parameters that are used for new/unused polishing pads in the planarization tool 100. The one or more parameters may include a rotational velocity of the semiconductor wafer 224a, a downward force that is used to press the semiconductor wafer 224a against the polishing pad 204, a polishing path along which the semiconductor wafer 224a traverses in the planarization operation 616, and/or a time duration of the planarization operation 616, among other examples.

In some implementations, the CMP controller 250 determines the one or more parameters as part of the pad analysis operation 602. In some implementations, the CMP controller 250 determines the one or more parameters as part of the planarization operation. In some implementations, the CMP controller 250 determines the one or more parameters after the pad analysis operation 602 and prior to the planarization operation 616.

Figure 6D:
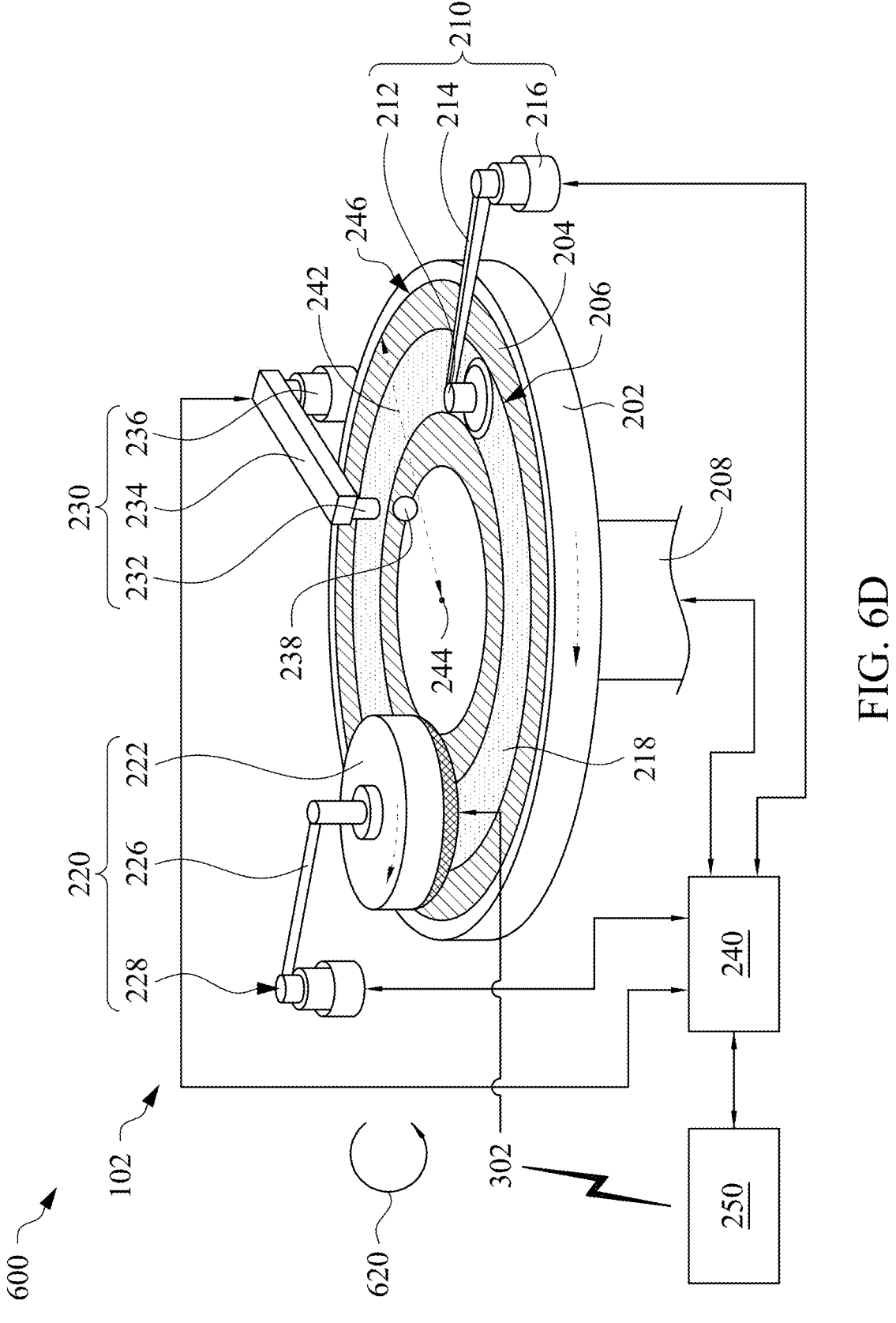
Figure 6E:
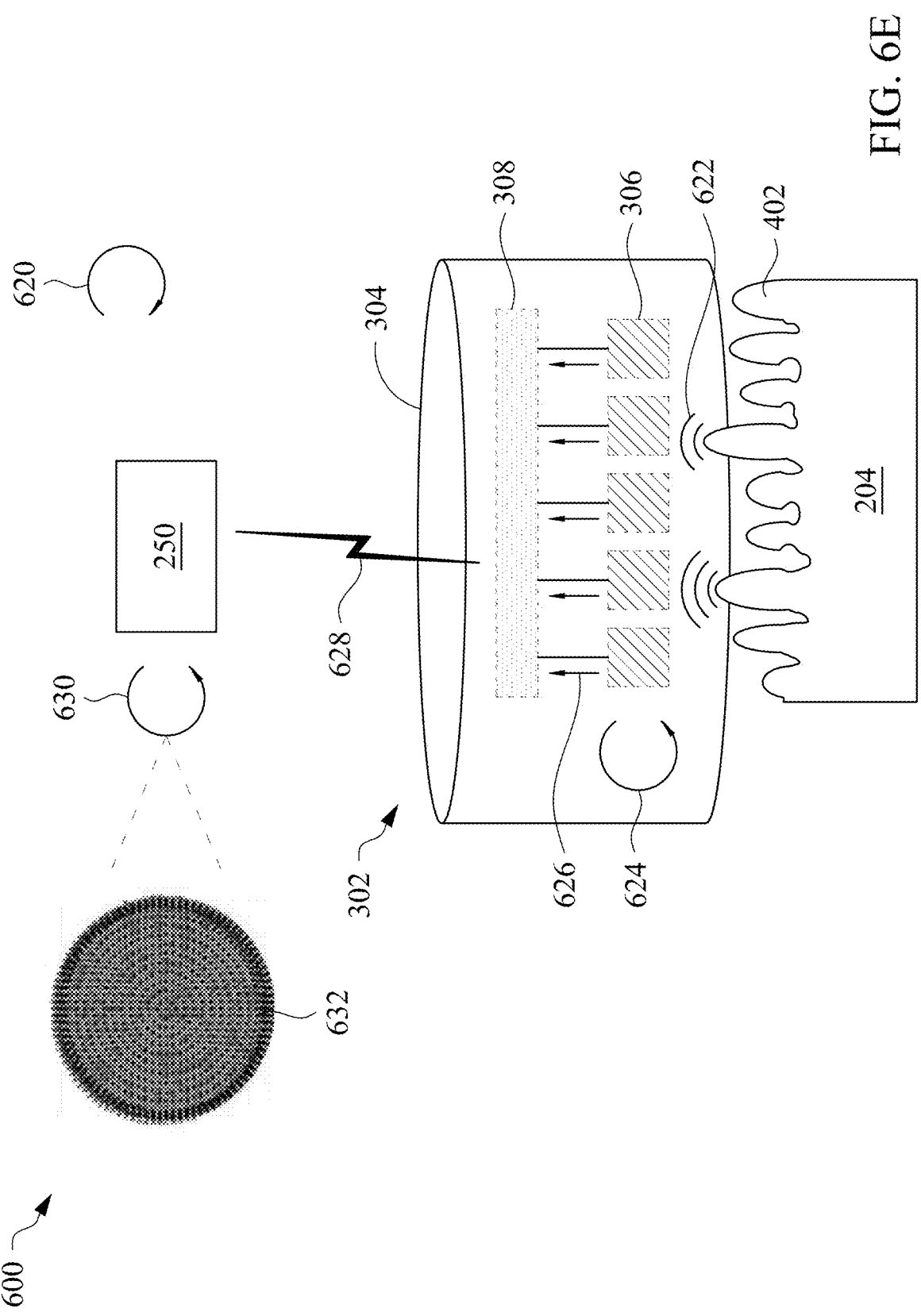

As shown in FIGS. 6D and 6E, a pad analysis operation 620 may be performed for the polishing pad 204 of the planarization tool 100. The pad analysis operation 620 may include securing the piezoelectric pad monitoring device 302 to the polishing head 222 of the planarization tool 100 and establishing a communication connection between the piezoelectric pad monitoring device 302 and the CMP controller 250, as shown in FIG. 6D.

The pad analysis operation 620 may be performed after the planarization operation 616. In some implementations, the pad analysis operation 620 may be performed after a particular quantity of planarization operations (e.g., 50 planarization operations, 100 planarization operations) including the planarization operation 616. In some implementations, the pad analysis operation 620 may be performed after a particular time duration after the pad analysis operation 602 (e.g., 30 days, 60 days). This enables the CMP controller 250 to update the pad contact map 614 as the polishing pad 204 is used to track and monitor wearing of the pad contacts 402 on the polishing pad 204.

As shown in FIG. 6E, in the pad analysis operation 620, the piezoelectric pad monitoring device 302 may be pressed against the surface of the polishing pad 204 such that the pad contacts 402 of the polishing pad 204 are in contact with the body 304 of the piezoelectric pad monitoring device 302. The CMP controller 250 may transmit a signal to the motor assembly 240, which causes the motor assembly 240 to control the wafer carrier 220 such that the wafer carrier 220 applies a downward force to press the piezoelectric pad monitoring device 302 against the polishing pad 204. The downward force that is used to press the piezoelectric pad monitoring device 302 against the polishing pad 204 in the pad analysis operation 620 may be approximately the same downward force that was used to press the piezoelectric pad monitoring device 302 against the polishing pad 204 in the pad analysis operation 602. Generally, the same downward force may be used for the same polishing pad in the pad analysis operations for the polishing pad such that a consistent setpoint is used to generate measurements of the quantity of pad contacts on the polishing pad. In other words, using different downward force magnitudes for different pad analysis operations for a polishing pad may result in some pad contacts being counted in one pad analysis operation but not in another pad analysis operation. Using approximately the same downward force enables the quantity of pad contacts 402 on the polishing pad 204 to be tracked across a plurality of pad analysis operations.

As further shown in FIG. 6E, the downward force of the piezoelectric pad monitoring device 302 against the pad contacts 402 of the polishing pad 204 causes stresses 622 to be induced in the body 304 of the piezoelectric pad monitoring device 302. The stresses 622 are exerted on the piezoelectric sensing region(s) 306. At 624, the stresses 622 cause the piezoelectric sensing region(s) 306 to generate a signal 626 (e.g., a voltage signal, a current signal) that is provided to the processor 308. The processor 308 receives the signal 626 and transmits a communication 628 to the CMP controller 250 indicating results of one or more measurements of the signal 626. The CMP controller 250 may receive the communication 628 and may determine a quantity of pad contacts 402 for the polishing pad 204 based on the results of the one or more measurements. The CMP controller 250 may determine the quantity of pad contacts 402 using one or more techniques described in connection with FIG. 4 and/or elsewhere herein.

The piezoelectric pad monitoring device 302 may be moved around the surface of the polishing pad 204 such that measurements and quantities of pad contacts 402 may be determined for other regions of the polishing pad 204. At 630, the CMP controller 250 may generate an updated pad contact map 632 based on the quantities of pad contacts 402 determined based on the measurements in the regions of the polishing pad 204. The updated pad contact map 632 may include a representation of the locations of the pad contacts 402 on the polishing pad 204. In some implementations, the updated pad contact map 632 may include a visual/graphical representation that can be displayed on a display of the planarization tool 100. The CMP controller 250 may index the pad contacts 402 based on the measurements performed by the piezoelectric pad monitoring device 302, and may determine the locations of the pad contacts 402 in the updated pad contact map 632 based on indexing the pad contacts 402.

In some implementations, the updated pad contact map 632 may further include a visual indication (e.g., shading, coloring) of whether a pad contact 402 is counted or not. The CMP controller 250 may compare the pad contact map 614 with the updated pad contact map 632 to identify pad contacts 402 that were counted in the pad contact map 614 and are no longer counted in the updated pad contact map 632. The CMP controller 250 may determine these pad contacts 402 to be worn out, and the CMP controller 250 may visually indicate these pad contacts 402 in the updated pad contact map 632 accordingly. In some implementations, the updated pad contact map 632 indicates respective contact heights H for one or more pad contacts 402 on the polishing pad 204 (e.g., by shading and/or coloring).

In some implementations, the updated pad contact map 632 may further include a visual indication (e.g., shading, coloring) of the density of worn out pad contacts 402 in different regions of the polishing pad 204. A different color and/or shading may be associated with a particular density range, and the CMP controller 250 may assign a color and/or shading to a region of the polishing pad 204 in the updated pad contact map 632 that corresponds to the density range in which the density of worn out pad contacts 402 in the region is included.

Figure 6F:
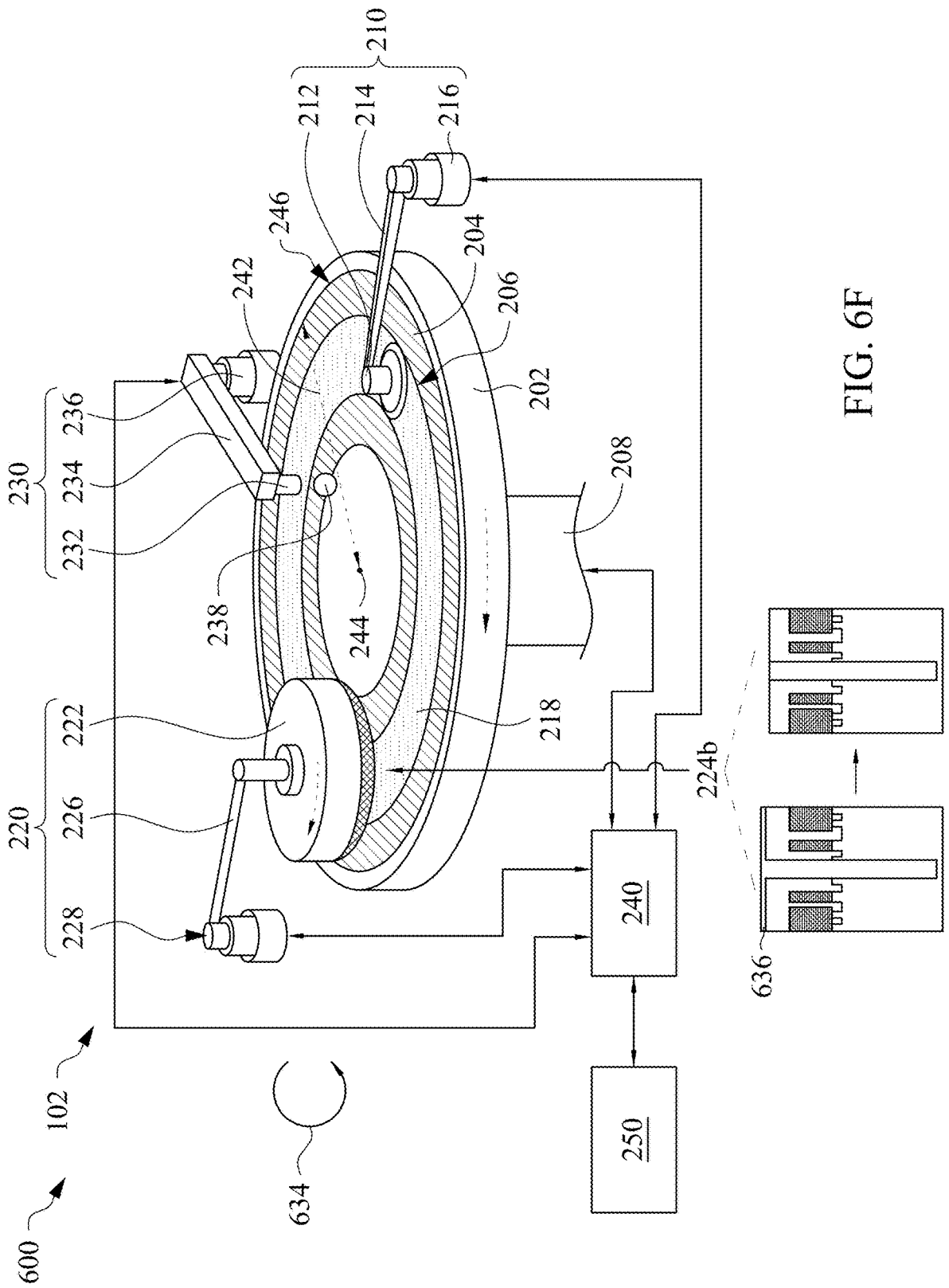

As shown in FIG. 6F, a planarization operation 634 may be performed to planarize a layer 636 on a semiconductor wafer 224b. The layer 636 may include a metallization layer and/or another type of layer. For example, the layer 636 may include a via, a plug, a contact, a trench, a TSV, a TIV, and/or another type of metallization layer. In some implementations, the planarization operation 634 may be performed to remove excess material from the layer 636. In some implementations, the planarization operation 634 may be performed to increase the uniformity of the top surface of the layer 636.

The planarization operation 634 may include securing the semiconductor wafer 224b to the polishing head 222 in the processing chamber 102 of the planarization tool 100. The planarization operation 634 may include pressing, using the polishing head 222, the semiconductor wafer 224b against the polishing pad 204 in the processing chamber 102 to planarize the layer 636 on the semiconductor wafer 224b.

The CMP controller 250 may determine one or more parameters (e.g., updated parameters) for the planarization operation 634. The CMP controller 250 may determine the one or more parameters for the planarization operation 634 based on the updated pad contact map 632 for the polishing pad 204 that was generated as part of the pad analysis operation 620. The one or more parameters may include a rotational velocity of the semiconductor wafer 224b, a downward force that is used to press the semiconductor wafer 224b against the polishing pad 204, a polishing path along which the semiconductor wafer 224b traverses in the planarization operation 634, and/or a time duration of the planarization operation 616, among other examples.

As indicated above, the one or more parameters determined for the planarization operation 634 may be different from the one or more parameters determined for the planarization operation 616. The parameters for the planarization operations 616 and 634 may be different due to wearing of the polishing pad 204 from use of the polishing pad 204. In particular, use of the polishing pad 204 may cause pad contacts 402 on the polishing pad 204 to wear down (e.g., reduce in height H). Accordingly, the one or more parameters determined for the planarization operation 634 may be different from the one or more parameters determined for the planarization operation 616 to maintain or achieve approximately a same polishing rate for the planarization operations 616 and 634, among other examples. This may enable the planarization tool 100 to achieve a greater surface uniformity of the layer 636 on the semiconductor wafer 224b than if the pad analysis operations 602 and 620 were not performed.

Additionally, and/or alternatively, the CMP controller 250 may determine the one or more parameters for the planarization operation 634 based on trends in the wearing of the pad contacts 402 on the polishing pad 204. The CMP controller 250 may identify a trend in the wearing of the pad contacts 402 based on a comparison of the pad contact map 614 and the updated pad contact map 632 (as well as additional pad contact maps for the polishing pad 204). This enables the CMP controller 250 may determine the one or more parameters such that the one or more parameters may correct issues with uneven wearing of the pad contacts 402 on the polishing pad 204.

Moreover, the CMP controller 250 may use a machine learning model 260 to identify the trends and/or to determine the one or more parameters based on the pad contact map 614 and the updated pad contact map 632 (as well as additional pad contact maps for the polishing pad 204). In some implementations, the CMP controller 250 uses the machine learning model to determine the one or more parameters by providing candidate parameters as input to the machine learning model, and using the machine learning model to determine a predicted or estimated pad contact map and a likelihood, probability, or confidence that the candidate parameters will achieve the predicted or estimated pad contact map. In some implementations, the CMP controller 250 provides a target pad contact map (e.g., a pad contact map that is to be achieved in a subsequent pad analysis operation) as input to the machine learning model, and the CMP controller 250 uses the machine learning model to determine or identify a particular combination of parameters for one or more subsequent planarization operations that are likely to achieve the target pad contact map.

The CMP controller 250 (or another system) may train, update, and/or refine the machine learning model to increase the accuracy of the outcomes and/or parameters determined using the machine learning model. The CMP controller 250 (or another system) may train, update, and/or refine the machine learning model based on feedback and/or results from historical and/or subsequent pad analysis operations and/or planarization operations (e.g., from hundreds, thousands, or more historical and/or subsequent operations) performed by the planarization tool 100.

As indicated above, FIGS. 6A-6F are provided as an example. Other examples may differ from what is described with regard to FIGS. 6A-6F.

Figure 7:
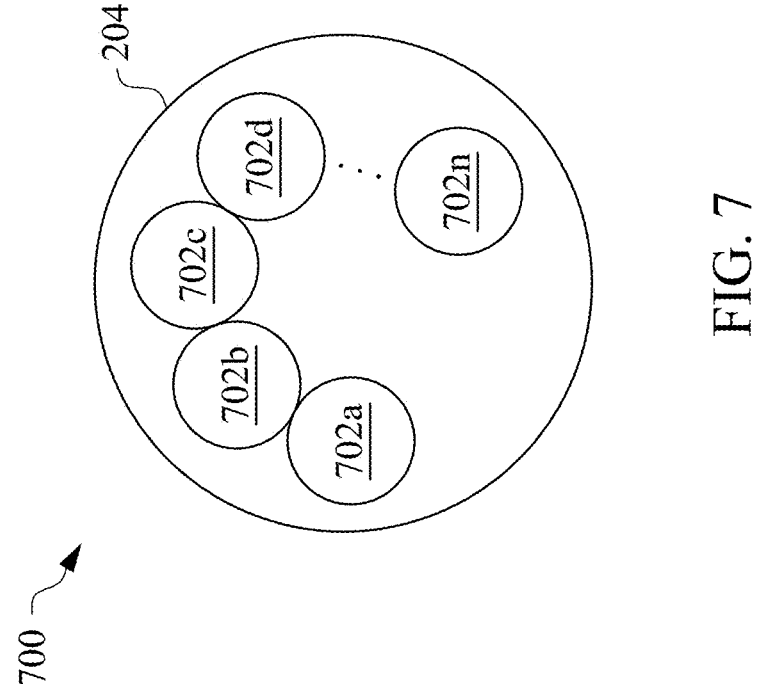
FIG. 7 is a diagram of an example implementation of parameter selection for a polishing pad based on results of measurements performed using the piezoelectric pad monitoring device described herein.

FIG. 7 is a diagram of an example implementation 700 of parameter selection for a polishing pad 204 based on results of measurements performed using the piezoelectric pad monitoring device 302 described herein. In particular, the example implementation 700 may include an example of determining parameter sets (that include one or more parameters) for different regions (e.g., regions 702a-702n) of a polishing pad 204 of the planarization tool 100. The CMP controller 250 may determine the parameter sets based on one or more pad analysis operations (e.g., as described in connection with FIGS. 4, 6A, 6B, 6D, and/or 6E) in which the piezoelectric pad monitoring device 302 per forms measurements of the regions 702a-702n of the polishing pad 204 and provides results of the measurements to the CMP controller 250.

As shown in FIG. 7, the regions 702a-702n of the polishing pad 204 may be non-overlapping regions of the polishing pad 204. Additionally, and/or alternatively, parameter sets may be determined for two or more partially overlapping regions of the polishing pad 204. Parameter sets may be determined (e.g., by the CMP controller 250) for different regions (e.g., regions 702a-702n) of a polishing pad 204 to achieve precise and localized parameter tuning for a planarization operation, performed by the planarization tool 100, for planarizing a layer on a semiconductor wafer 224. As an example, the CMP controller 250 may determine one or more first parameters for the region 702a, may determine one or more second parameters for the region 702b, and so on for the remaining regions 702c-702n of the polishing pad 204.

In some implementations, the CMP controller 250 determines the same parameters for two or more regions (e.g., region 702a and 702b). In some implementations, the CMP controller 250 determines different parameters for two or more regions (e.g., region 702b and 702c). For example, the CMP controller 250 may determine a first downward force for the region 702b (e.g., for pressing the semiconductor wafer 224 against the polishing pad 204 in the region 702b) and a second downward force for the region 702c (e.g., for pressing the semiconductor wafer 224 against the polishing pad 204 in the region 702c), where the first downward force and the second downward force are different downward force magnitudes. As another example, the CMP controller 250 may determine a first rotational velocity of the polishing head 222 for the region 702c (e.g., for rotating the semiconductor wafer 224 in the region 702c) and a second rotational velocity of the polishing head 222 for the region 702d (e.g., for rotating the semiconductor wafer 224 in the region 702d), where the first rotational velocity and the second rotational velocity are different rotational velocities.

In general, the CMP controller 250 may determine and tune parameters for regions of the polishing pad 204 to achieve an approximately uniform polishing rate across the polishing pad 204 and/or to achieve an approximately uniform polishing rate across a semiconductor wafer 224 that is planarized in planarization operation performed by the planarization tool 100. For example, the CMP controller 250 may determine a greater rotational velocity and/or a greater downward force for a first region (e.g., region 702a) of the polishing pad 204 relative to the rotational velocity and/or the downward force for a second region (e.g., region 702b) of the polishing pad 204 based on determining that the quantity of pad contacts 402 in the second region is greater relative to the quantity of pad contacts 402 in the first region. The greater rotational velocity and/or the greater downward force for the first region may increase the likelihood that the polishing rate in the first region is approximately equal to the polishing rate in the second region.

As another example, the CMP controller 250 may determine a lesser rotational velocity and/or a lesser downward force for a first region (e.g., region 702b) of the polishing pad 204 relative to the rotational velocity and/or the downward force for a second region (e.g., region 702c) of the polishing pad 204 based on determining that the quantity of pad contacts 402 in the second region is lesser relative to the quantity of pad contacts 402 in the first region. The lesser rotational velocity and/or the lesser downward force for the first region may increase the likelihood that the polishing rate in the first region is approximately equal to the polishing rate in the second region.

As another example, the CMP controller 250 may determine a greater time duration for polishing a semiconductor wafer 224 in a first region (e.g., region 702c) of the polishing pad 204 relative to a time duration for polishing the semiconductor wafer 224 for a second region (e.g., region 702d) of the polishing pad 204 based on determining that the quantity of pad contacts 402 in the second region is greater relative to the quantity of pad contacts 402 in the first region. The greater time duration in the first region may compensate for the lesser polishing rate in the first region relative to the polishing rate in the second region.

In some implementations, the CMP controller 250 may determine one or more global parameters for a planarization operation based on results of measurements performed by the piezoelectric pad monitoring device 302 in each of the regions 702c-702n of the polishing pad 204. For example, the CMP controller 250 may determine respective estimated polishing rates in each of the regions 702c-702n of the polishing pad 204 based on results of measurements in each of the regions 702c-702n. The CMP controller 250 may determine a polishing path along which the semiconductor wafer 224 is to traverse in the planarization operation based on the respective estimated polishing rates in each of the regions 702c-702n of the polishing pad 204. In particular, the CMP controller 250 may determine the polishing path to avoid or make less use of regions having a lesser quantity of pad contacts 402 (and therefore, a lesser polishing rate), and/or to include multiple passes in regions having a greater quantity of pad contacts 402 (and therefore, a greater polishing rate). In this way, the increased use of the regions having a greater quantity of pad contacts 402 may cause these regions to wear faster than the regions having a lesser quantity of pad contacts 402, which may achieve wear leveling of the regions of the polishing pad 204.

In some implementations, the CMP controller 250 may use a machine learning model in a similar manner as described above in connection with FIGS. 6A-6F to determine parameters for the regions 702a-702n of the polishing pad 204. For example, the CMP controller 250 may use a machine learning model to estimate and/or predict how certain parameters will affect the wearing of the polishing pad 204 in the regions 702a-702n over a plurality of planarization operations of the planarization tool 100. This may enable the CMP controller 250 to select parameters for the regions 702a-702n of the polishing pad 204 to achieve an approximately uniform level of wearing of the polishing pad 204 in the regions 702a-702n over the plurality of planarization operations of the planarization tool 100 so that the polishing rate for the polishing pad 204 remains approximately uniform and consistent across the regions 702a-702n over the plurality of planarization operations. Moreover, if the CMP controller 250 determines (e.g., based on results of measurements received from the piezoelectric pad monitoring device 302) that one or more of the regions 702a-702n are wearing faster than other regions of the polishing pad 204, the CMP controller 250 may use the machine learning model to determine parameters for the regions 702a-702n of the polishing pad 204 that are likely to bring the wear levels of the regions 702a-702n closer to uniformity. In some implementations, the planarization tool 100 may perform one or more dummy planarization operations (e.g., in which a sacrificial wafer or work piece is secured to the polishing head) using the parameters for the regions 702a-702n to bring the wear levels of the regions 702a-702n closer to uniformity.

As indicated above, FIG. 7 is provided as an example. Other examples may differ from what is described with regard to FIG. 7.

Figure 8:
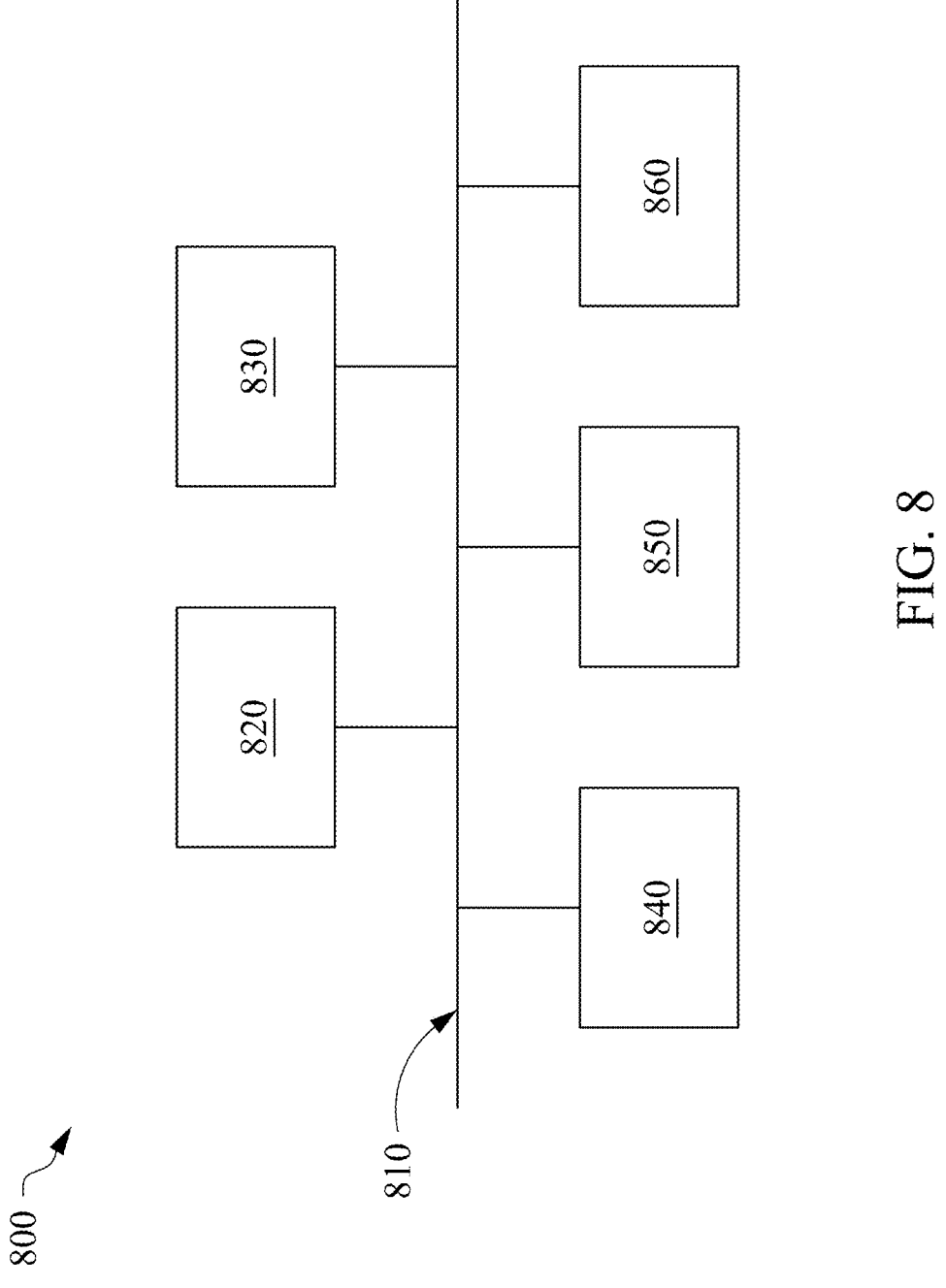
FIG. 8 is a diagram of example components of a device described herein.

FIG. 8 is a diagram of example components of a device 800 described herein. The device 800 may correspond to the planarization tool 100, the motor assembly 240, the CMP controller 250, the piezoelectric pad monitoring device 302, and/or the processor 308, among other examples. In some implementations, the planarization tool 100, the motor assembly 240, the CMP controller 250, the piezoelectric pad monitoring device 302, and/or the processor 308, among other examples, may include one or more devices 800 and/or one or more components of the device 800. As shown in FIG. 8, the device 800 may include a bus 810, a processor 820, a memory 830, an input component 840, an output component 850, and/or a communication component 860.

The bus 810 may include one or more components that enable wired and/or wireless communication among the components of the device 800. The bus 810 may couple together two or more components of FIG. 8, such as via operative coupling, communicative coupling, electronic coupling, and/or electric coupling. For example, the bus 810 may include an electrical connection (e.g., a wire, a trace, and/or a lead) and/or a wireless bus. The processor 820 may include a central processing unit, a graphics processing unit, a microprocessor, a controller, a microcontroller, a digital signal processor, a field-programmable gate array, an application-specific integrated circuit, and/or another type of processing component. The processor 820 may be implemented in hardware, firmware, or a combination of hardware and software. In some implementations, the processor 820 may include one or more processors capable of being programmed to perform one or more operations or processes described elsewhere herein.

The memory 830 may include volatile and/or nonvolatile memory. For example, the memory 830 may include random access memory (RAM), read only memory (ROM), a hard disk drive, and/or another type of memory (e.g., a flash memory, a magnetic memory, and/or an optical memory). The memory 830 may include internal memory (e.g., RAM, ROM, or a hard disk drive) and/or removable memory (e.g., removable via a universal serial bus connection). The memory 830 may be a non-transitory computer-readable medium. The memory 830 may store information, one or more instructions, and/or software (e.g., one or more software applications) related to the operation of the device 800. In some implementations, the memory 830 may include one or more memories that are coupled (e.g., communicatively coupled) to one or more processors (e.g., processor 820), such as via the bus 810. Communicative coupling between a processor 820 and a memory 830 may enable the processor 820 to read and/or process information stored in the memory 830 and/or to store information in the memory 830.

The input component 840 may enable the device 800 to receive input, such as user input and/or sensed input. For example, the input component 840 may include a touch screen, a keyboard, a keypad, a mouse, a button, a microphone, a switch, a sensor, a global positioning system sensor, an accelerometer, a gyroscope, and/or an actuator. The output component 850 may enable the device 800 to provide output, such as via a display, a speaker, and/or a light-emitting diode. The communication component 860 may enable the device 800 to communicate with other devices via a wired connection and/or a wireless connection. For example, the communication component 860 may include a receiver, a transmitter, a transceiver, a modem, a network interface card, and/or an antenna.

The device 800 may perform one or more operations or processes described herein. For example, a non-transitory computer-readable medium (e.g., memory 830) may store a set of instructions (e.g., one or more instructions or code) for execution by the processor 820. The processor 820 may execute the set of instructions to perform one or more operations or processes described herein. In some implementations, execution of the set of instructions, by one or more processors 820, causes the one or more processors 820 and/or the device 800 to perform one or more operations or processes described herein. In some implementations, hardwired circuitry may be used instead of or in combination with the instructions to perform one or more operations or processes described herein. Additionally, or alternatively, the processor 820 may be configured to perform one or more operations or processes described herein. Thus, implementations described herein are not limited to any specific combination of hardware circuitry and software.

The number and arrangement of components shown in FIG. 8 are provided as an example. The device 800 may include additional components, fewer components, different components, or differently arranged components than those shown in FIG. 8. Additionally, or alternatively, a set of components (e.g., one or more components) of the device 800 may perform one or more functions described as being performed by another set of components of the device 800.

Figure 9:
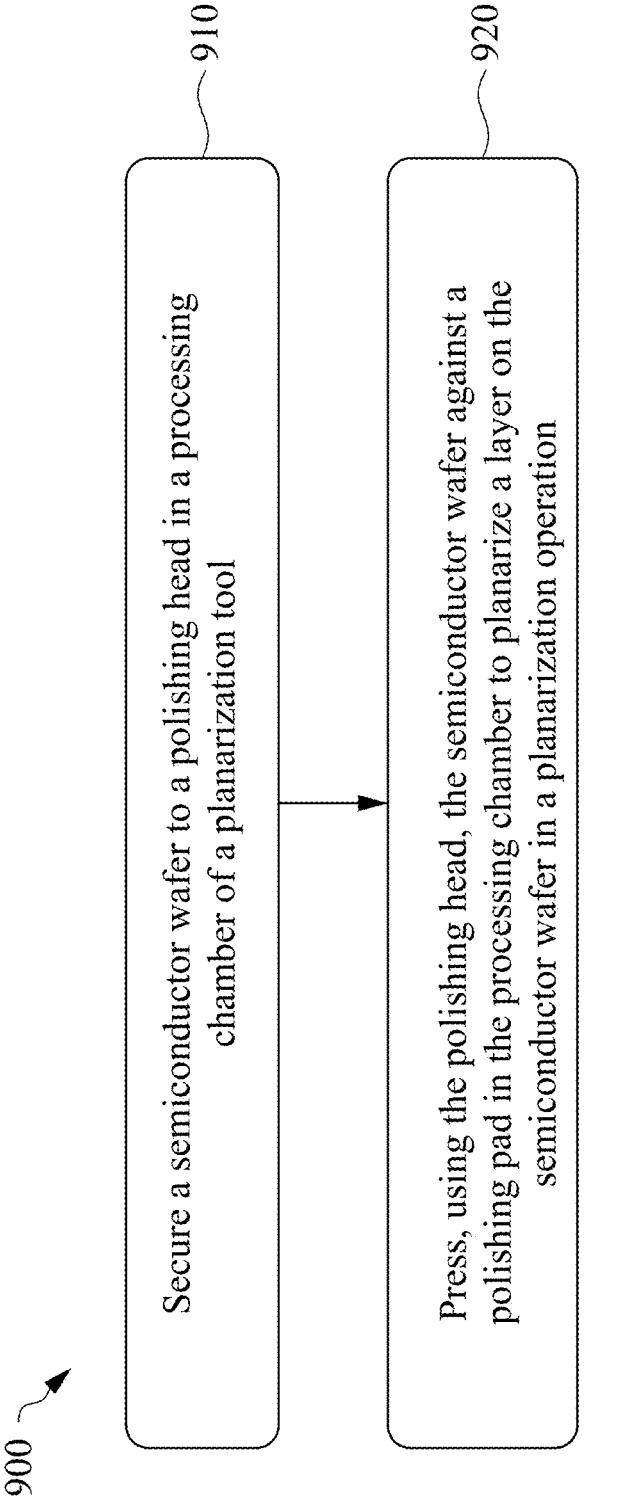
FIG. 9 is a flowchart of an example process associated with a planarization operation described herein.

FIG. 9 is a flowchart of an example process 900 associated with a planarization operation described herein. In some implementations, one or more process blocks of FIG. 9 are performed by a planarization tool 100 (e.g., planarization tool 100). In some implementations, one or more process blocks of FIG. 9 are performed by another device or a group of devices separate from or including the planarization tool 100, such as a motor assembly (e.g., the motor assembly 240), a CMP controller (e.g., the CMP controller 250), and/or a piezoelectric pad monitoring device (e.g., the piezoelectric pad monitoring device 302), among other examples. Additionally, or alternatively, one or more process blocks of FIG. 9 may be performed by one or more components of device 800, such as processor 820, memory 830, input component 840, output component 850, and/or communication component 860.

As shown in FIG. 9, process 900 may include securing a semiconductor wafer to a polishing head in a processing chamber of a planarization tool (block 910). For example, a semiconductor wafer (e.g., a semiconductor wafer 224, a semiconductor wafer 224a, a semiconductor wafer 224b) may be secured to a polishing head 222 in a processing chamber 102 of the planarization tool 100, as described herein.

As further shown in FIG. 9, process 900 may include pressing, using the polishing head, the semiconductor wafer against a polishing pad in the processing chamber to planarize a layer on the semiconductor wafer in a planarization operation (block 920). For example, the planarization tool 100 may press, using the polishing head 222, the semiconductor wafer against a polishing pad 204 in the processing chamber 102 to planarize a layer (e.g., a layer 618, a layer 636) on the semiconductor wafer in a planarization operation (e.g., a planarization operation 616, a planarization operation 634), as described herein.

Process 900 may include additional implementations, such as any single implementation or any combination of implementations described below and/or in connection with one or more other processes described elsewhere herein.

In a first implementations, one or more parameters of the planarization operation are based on a pad contact map (e.g., a pad contact map 614, an updated pad contact map 632), for the polishing pad 204, that was generated using a piezoelectric pad monitoring device 302. In a second implementation, alone or in combination with the first implementation, the one or more parameters include at least one of a rotational velocity of the semiconductor wafer, a downward force that is used to press the semiconductor wafer against the polishing pad 204, a polishing path along which the semiconductor wafer traverses in the planarization operation, or a time duration of the planarization operation. In a third implementation, alone or in combination with the first or second implementations, the pad contact map indicates respective contact heights for each of one or more pad contacts 402 on the polishing pad 204. In a fourth implementation, alone or in combination with one or more of the first through third implementations, the pad contact map is based on a voltage signal that was generated by the piezoelectric pad monitoring device 302 as the piezoelectric pad monitoring device 302 was pressed against the polishing pad 204 in a pad analysis operation that was performed prior to the planarization operation.

In a fifth implementation, alone or in combination with one or more of the first through fourth implementations, the voltage signal was generated by the piezoelectric pad monitoring device 302 based on stresses induced in the piezoelectric pad monitoring device 302. In a sixth implementation, alone or in combination with one or more of the first through fifth implementations, the piezoelectric pad monitoring device 302 was moved along the polishing pad 204 in the pad analysis operation such that voltage measurements are performed in non-overlapping regions 502 of the polishing pad 204. In a seventh implementation, alone or in combination with one or more of the first through sixth implementations, the piezoelectric pad monitoring device 302 was moved along the polishing pad 204 in the pad analysis operation such that voltage measurements were continuously performed along a movement path 506 of the polishing pad 204.

In an eighth implementation, alone or in combination with one or more of the first through seventh implementations, the pad contact map was generated in a first pad analysis operation (e.g., a pad analysis operation 602) that was performed prior to a first use of the polishing pad 204 in the planarization tool 100, and process 900 includes generating an updated pad contact map 632 based on a second pad analysis operation (e.g., a pad analysis operation 620) that is performed, after the planarization operation, using the piezoelectric pad monitoring device 302, and determining one or more updated parameters for a subsequent planarization operation based on the updated pad contact map 632. In a ninth implementation, alone or in combination with one or more of the first through eighth implementations, the piezoelectric pad monitoring device 302 is pressed against the polishing pad 204 using a same downward force magnitude in the first pad analysis operation and the second pad analysis operation.

In a tenth implementation, one or more first parameters are used for planarizing the layer in a first region (e.g., a first region of regions 702a-702n) of the polishing pad 204 in the planarization operation, one or more second parameters are used for planarizing the layer in a second region (e.g., a second region of the regions 702a-702n) of the polishing pad 204 in the planarization operation, and the one or more first parameters and the one or more second parameters are based on an analysis (e.g., a pad analysis operation 602, a pad analysis operation 620), of pad contacts 402 on the polishing pad 204, that was performed using the piezoelectric pad monitoring device 302.

In an eleventh implementation, alone or in combination with the tenth implementation, the piezoelectric pad monitoring device 302 is pressed against the polishing pad 204 in a pad analysis operation to enable the analysis of the pad contacts 402 on the polishing pad 204, and a downward force that is used to press the piezoelectric pad monitoring device 302 against the polishing pad in the pad analysis operation is based on at least one of a material of the polishing pad, or a hardness of the polishing pad. In a twelfth implementation, alone or in combination with one or more of the tenth or eleventh implementation, process 900 includes determining, by a CMP controller 250 of the planarization tool 100, the one or more first parameters and the one or more second parameters using a machine learning model in the analysis of the pad contacts.

In a thirteenth implementation, alone or in combination with one or more of the tenth through twelfth implementations, the one or more first parameters include a first rotational velocity of the semiconductor wafer, the one or more second parameters include a second rotational velocity of the semiconductor wafer, and the first rotational velocity and the second rotational velocity are different rotational velocities. In a fourteenth implementation, alone or in combination with one or more of the tenth through thirteenth implementations, the one or more first parameters include a first downward force for pressing the semiconductor wafer against the polishing pad 204 in the first region, the one or more second parameters include a second downward force for pressing the semiconductor wafer against the polishing pad 204 in the second region, and the first downward force and the second downward force are different downward forces. In a fifteenth implementation, alone or in combination with one or more of the tenth through fourteenth implementations, the analysis of the pad contacts 402 on the polishing pad 204 is based on respective heights H of the pad contacts 402 on the polishing pad 204.

Although FIG. 9 shows example blocks of process 900, in some implementations, process 900 includes additional blocks, fewer blocks, different blocks, or differently arranged blocks than those depicted in FIG. 9. Additionally, or alternatively, two or more of the blocks of process 900 may be performed in parallel.

Figure 10:
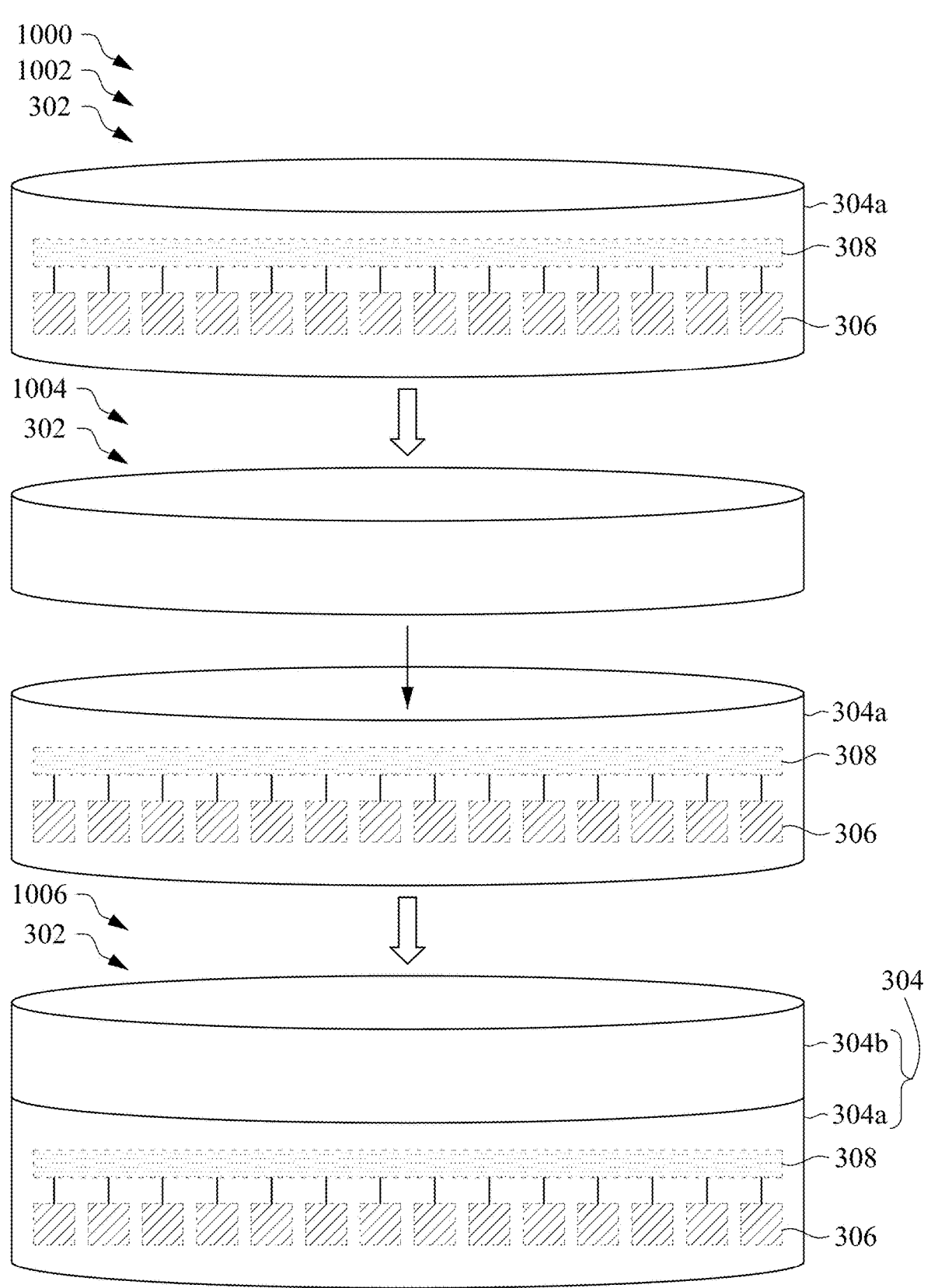
FIG. 10 is a diagram of an example process associated with forming a piezoelectric pad monitoring device described herein.

FIG. 10 is a diagram of an example process 1000 associated with forming a piezoelectric pad monitoring device 302 described herein.

As shown in FIG. 10, at 1002, a first wafer 304a may be provided for the piezoelectric pad monitoring device 302. The first wafer 304a may include a silicon wafer a glass (e.g., silicon dioxide) wafer, and/or another type of wafer that is approximately circular shaped. In some implementations, the first wafer 304a may have substantially smooth top and bottom silicon surfaces similar to a silicon wafer on which semiconductor devices are formed, or substantially smooth top and bottom glass surfaces. As further shown in FIG. 10, at 1002, the piezoelectric sensing regions 306 and the processor 308 may be embedded in the first wafer 304a. In some implementations, the piezoelectric sensing regions 306 and the processor 308 may be molded into in the first wafer 304a. In some implementations, the piezoelectric sensing regions 306 and the processor 308 may be secured to the first wafer 304a, and a molding compound may be dispensed around the piezoelectric sensing regions 306 and the processor 308 to secure the piezoelectric sensing regions 306 and the processor 308 in place.

As further shown in FIG. 10, at 1004, the first wafer 304a may be bonded with a second wafer 304b to encapsulate the piezoelectric sensing regions 306 and the processor 308 in between the first wafer 304a and the second wafer 304b. The second wafer 304b may include a silicon wafer a glass (e.g., silicon dioxide) wafer, and/or another type of wafer that is approximately circular shaped. In some implementations, the second wafer 304b may have substantially smooth top and bottom silicon surfaces similar to a silicon wafer on which semiconductor devices are formed, or substantially smooth top and bottom glass surfaces.

As further shown in FIG. 10, at 1006, the first wafer 304a and the second wafer 304b may correspond to the body 304 of the piezoelectric pad monitoring device 302. The piezoelectric sensing regions 306 and the processor 308 may be included in the body 304 of the piezoelectric pad monitoring device 302. The body 304 may have substantially smooth top and bottom silicon surfaces similar to a silicon wafer on which semiconductor devices are formed, or substantially smooth top and bottom glass surfaces.

As indicated above, FIG. 10 is provided as an example. Other examples may differ from what is described with regard to FIG. 10.

In this way, a planarization tool is configured to monitor and analyze the condition of a polishing pad over the life of the polishing pad. A piezoelectric pad monitoring device may be mounted to a polishing head in place of a semiconductor wafer. The piezoelectric pad monitoring device may be pressed against the polishing pad. When pressed against the polishing pad, the piezoelectric pad monitoring device may generate a signal based on a quantity of pad contacts, on the polishing pad, that are in contact with the piezoelectric pad monitoring device. The signal may be provided to a processor of the planarization tool so that the processor may generate, based on the signal, a map of the pad contacts on the polishing pad. The processor may use the map of the pad contacts to determine one or more properties of the polishing pad such as roughness and/or uniformity, among other examples. The processor may identify modify or tailor the operation of the planarization tool based on the one or more properties of the polishing pad. Additionally, and/or alternatively, the processor may identify areas of the polishing for maintenance and/or rework based on the one or more properties of the polishing pad.

As described in greater detail above, some implementations described herein provide a method. The method includes securing a semiconductor wafer to a polishing head in a processing chamber of a planarization tool. The method includes pressing, using the polishing head, the semiconductor wafer against a polishing pad in the processing chamber to planarize a layer on the semiconductor wafer in a planarization operation, where one or more parameters of the planarization operation are based on a pad contact map, for the polishing pad, that was generated using a piezoelectric pad monitoring device.

As described in greater detail above, some implementations described herein provide a method. The method includes securing a semiconductor wafer to a polishing head in a processing chamber of a planarization tool. The method includes pressing, using the polishing head, the semiconductor wafer against a polishing pad in the processing chamber to planarize a layer on the semiconductor wafer in a planarization operation, where one or more first parameters are used for planarizing the layer in a first region of the polishing pad in the planarization operation, where one or more second parameters are used for planarizing the layer in a second region of the polishing pad in the planarization operation, and where the one or more first parameters and the one or more second parameters are based on an analysis, of pad contacts on the polishing pad, that was performed using a piezoelectric pad monitoring device.

As described in greater detail above, some implementations described herein provide a piezoelectric pad monitoring device. The piezoelectric pad monitoring device includes a body, where the body is configured to be secured to a polishing head of a planarization tool. The piezoelectric pad monitoring device includes one or more piezoelectric sensing regions included in the body. The piezoelectric pad monitoring device includes a processor included in the body and communicatively coupled with the one or more piezoelectric sensing regions.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   securing a semiconductor wafer to a polishing head in a processing chamber of a planarization tool;
   pressing, using the polishing head, the semiconductor wafer against a polishing pad in the processing chamber to planarize a layer on the semiconductor wafer in a planarization operation,
      wherein one or more parameters of the planarization operation are based on a pad contact map, for the polishing pad, that was generated using a piezoelectric pad monitoring device;

receiving, while pressing the semiconductor wafer against the polishing pad, an electrical signal indicating a surface roughness of the polishing bad; and updating, based on the electrical signal and while pressing the semiconductor wafer against the polishing pad, the one or more parameters to adjust to the surface roughness of the polishing pad.

2. The method of claim 1, wherein the one or more parameters comprise at least one of:

a rotational velocity of the semiconductor wafer, a downward force that is used to press the semiconductor wafer against the polishing pad, a polishing path along which the semiconductor wafer traverses in the planarization operation, or a time duration of the planarization operation.

3. The method of claim 1, wherein the pad contact map indicates respective contact heights for each of one or more pad contacts on the polishing pad.

4. The method of claim 1, wherein the pad contact map is based on a voltage signal that was generated by the piezoelectric pad monitoring device as the piezoelectric pad monitoring device was pressed against the polishing pad in a pad analysis operation that was performed prior to the planarization operation.

5. The method of claim 4, wherein the voltage signal was generated by the piezoelectric pad monitoring device based on stresses induced in the piezoelectric pad monitoring device.

6. The method of claim 4, wherein the piezoelectric pad monitoring device was moved along the polishing pad in the pad analysis operation such that voltage measurements are performed in non-overlapping regions of the polishing pad.

7. The method of claim 4, wherein the piezoelectric pad monitoring device was moved along the polishing pad in the pad analysis operation such that voltage measurements were continuously performed along a movement path of the polishing pad.

8. The method of claim 1, wherein the pad contact map was generated in a first pad analysis operation that was performed prior to a first use of the polishing pad in the planarization tool; and wherein the method further comprises:

generating, by a controller of the planarization tool, an updated pad contact map based on a second pad analysis operation that is performed, after the planarization operation, using the piezoelectric pad monitoring device; and determining, by the controller, one or more updated parameters for a subsequent planarization operation based on the updated pad contact map.

9. The method of claim 8, wherein the piezoelectric pad monitoring device is pressed against the polishing pad using a same downward force magnitude in the first pad analysis operation and the second pad analysis operation.

10. A method, comprising:

securing a semiconductor wafer to a polishing head in a processing chamber of a planarization tool; and pressing, using the polishing head, the semiconductor wafer against a polishing pad in the processing chamber to planarize a layer on the semiconductor wafer in a planarization operation, wherein one or more first parameters are used for planarizing the layer in a first region of the polishing pad in the planarization operation, wherein one or more second parameters are used for planarizing the layer in a second region of the polishing pad in the planarization operation, and wherein the one or more first parameters and the one or more second parameters are based on an analysis, of pad contacts on the polishing pad, that was performed using a piezoelectric pad monitoring device, wherein a downward force that is used to press the piezoelectric pad monitoring device against the polishing pad in a pad analysis operation is determined based on at least one of:

a material of the polishing pad, or a hardness of the polishing pad.

11. The method of claim 10, wherein the piezoelectric pad monitoring device is pressed against the polishing pad in the pad analysis operation to enable the analysis of the pad contacts on the polishing pad.

12. The method of claim 10, further comprising:

determining, by a controller of the planarization tool, the one or more first parameters and the one or more second parameters using a machine learning model trained to analyze the pad contacts to determine at least one property of the polishing pad.

13. The method of claim 10, wherein the one or more first parameters comprise a first rotational velocity of the semiconductor wafer;

wherein the one or more second parameters comprise a second rotational velocity of the semiconductor wafer; and wherein the first rotational velocity and the second rotational velocity are different rotational velocities.

14. The method of claim 10, wherein the one or more first parameters comprise a first downward force for pressing the semiconductor wafer against the polishing pad in the first region;

wherein the one or more second parameters comprise a second downward force for pressing the semiconductor wafer against the polishing pad in the second region; and wherein the first downward force and the second downward force are different downward forces.

15. The method of claim 10, wherein the analysis of the pad contacts on the polishing pad is based on respective heights of the pad contacts on the polishing pad.

16. A piezoelectric pad monitoring device, comprising:

a body, wherein the body is configured to be secured to a polishing head of a planarization tool;

one or more piezoelectric sensing regions included in the body; and a processor, included in the body and coupled with the one or more piezoelectric sensing regions, configured to determine a condition of a polishing pad based on a voltage signal, wherein the condition comprising at least one of a roughness of the polishing pad or a uniformity of the polishing pad.

17. The piezoelectric pad monitoring device of claim 16, wherein the one or more piezoelectric sensing regions are configured to:

generate the voltage signal based on stresses induced in the piezoelectric pad monitoring device; and provide the voltage signal to the processor.

18. The piezoelectric pad monitoring device of claim 17, wherein the processor is configured to transmit the voltage signal to a controller of the planarization tool.

19. The piezoelectric pad monitoring device of claim 16, wherein the one or more piezoelectric sensing regions comprise at least one of:

aluminum nitride (AlN), zinc oxide (ZnO), or lead zirconate titanate (PZT).

20. The piezoelectric pad monitoring device of claim 16, wherein the body of the piezoelectric pad monitoring device corresponds to a size and a shape of a semiconductor wafer that is configured to be secured to the polishing head.

\* \* \* \* \*